US012538852B2

(12) United States Patent
Yeh et al.

(10) Patent No.: US 12,538,852 B2
(45) Date of Patent: Jan. 27, 2026

(54) PACKAGE STRUCTURE CONTAINING CHIP STRUCTURE WITH INCLINED SIDEWALLS

(71) Applicant: Taiwan Semiconductor Manufacturing Company, Ltd., Hsinchu (TW)

(72) Inventors: Shu-Shen Yeh, Taoyuan (TW); Po-Chen Lai, Hsinchu County (TW); Che-Chia Yang, Taipei (TW); Li-Ling Liao, Hsinchu (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/624,686

(22) Filed: Apr. 2, 2024

(65) Prior Publication Data
US 2024/0250069 A1    Jul. 25, 2024

Related U.S. Application Data

(62) Division of application No. 17/459,314, filed on Aug. 27, 2021, now Pat. No. 11,978,722.

(51) Int. Cl.
| H01L 21/00 | (2006.01) |
| H01L 21/48 | (2006.01) |
| H01L 21/56 | (2006.01) |
| H01L 21/78 | (2006.01) |
| H01L 23/31 | (2006.01) |
| H01L 23/498 | (2006.01) |
| H01L 25/065 | (2023.01) |

(52) U.S. Cl.
CPC ...... *H01L 25/0655* (2013.01); *H01L 21/4857* (2013.01); *H01L 21/563* (2013.01); *H01L 21/78* (2013.01); *H01L 23/3185* (2013.01); *H01L 23/49822* (2013.01)

(58) Field of Classification Search
None
See application file for complete search history.

(56) References Cited

U.S. PATENT DOCUMENTS

| 8,350,381 | B2 * | 1/2013 | Theuss | B81C 1/0023 |
| | | | | 257/723 |
| 9,000,584 | B2 | 4/2015 | Lin | |
| 9,048,222 | B2 | 6/2015 | Hung | |
| 9,048,233 | B2 | 6/2015 | Wu | |

(Continued)

FOREIGN PATENT DOCUMENTS

| TW | 201903996 A | 1/2019 |
| TW | 202105658 A | 2/2021 |

OTHER PUBLICATIONS

Chinese language office action dated Dec. 12, 2022, issued in application No. TW 111110333.

*Primary Examiner* — Nicholas J Tobergte
(74) *Attorney, Agent, or Firm* — McClure, Qualey & Rodack, LLP

(57) ABSTRACT

A package structure is provided. The package structure includes a chip structure having opposite surfaces with different widths. The chip structure has an inclined sidewall between the opposite surfaces. The package structure also includes a protective layer laterally surrounding the chip structure.

20 Claims, 44 Drawing Sheets

(56) References Cited

U.S. PATENT DOCUMENTS

| | | |
|---|---|---|
| 9,064,879 B2 | 6/2015 | Hung |
| 9,111,949 B2 | 8/2015 | Yu |
| 9,263,511 B2 | 2/2016 | Yu |
| 9,281,254 B2 | 3/2016 | Yu |
| 9,368,460 B2 | 6/2016 | Yu |
| 9,372,206 B2 | 6/2016 | Wu |
| 9,496,189 B2 | 11/2016 | Yu |
| 10,770,405 B2 | 9/2020 | Huang |
| 11,024,616 B2 * | 6/2021 | Chen .................. H01L 23/3128 |
| 11,309,271 B2 | 4/2022 | Lai |
| 11,521,938 B2 * | 12/2022 | Cheng .................. H01L 23/552 |
| 2002/0042161 A1 * | 4/2002 | Sato .................. H01L 21/6835 257/E21.705 |
| 2003/0162369 A1 * | 8/2003 | Kobayashi .......... H01L 21/3043 257/E21.599 |
| 2008/0006900 A1 * | 1/2008 | Chan .................. H10D 62/117 257/E23.125 |
| 2008/0157342 A1 * | 7/2008 | Yang ...................... H01L 24/24 257/E21.705 |
| 2008/0197435 A1 * | 8/2008 | Yang .................... H10F 77/413 257/432 |
| 2011/0175225 A1 * | 7/2011 | Seddon ............. H01L 21/76898 257/E21.294 |
| 2016/0099195 A1 | 4/2016 | Huang |
| 2017/0103957 A1 * | 4/2017 | Li ...................... H01L 21/76892 |
| 2020/0035604 A1 * | 1/2020 | Rubin ................ H01L 23/5383 |
| 2020/0044099 A1 * | 2/2020 | Chang .................... H10F 71/00 |
| 2021/0098421 A1 * | 4/2021 | Wu .................. H01L 23/49811 |
| 2021/0111114 A1 * | 4/2021 | Lee .................. H01L 23/49838 |
| 2022/0181225 A1 * | 6/2022 | Chen ....................... H01L 24/14 |
| 2022/0310467 A1 * | 9/2022 | Tseng ..................... H01L 24/19 |

* cited by examiner

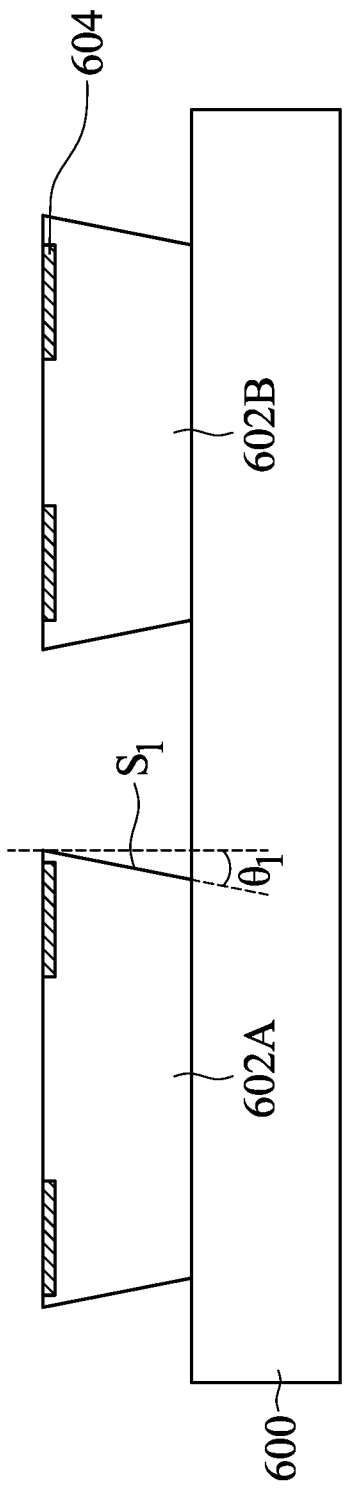
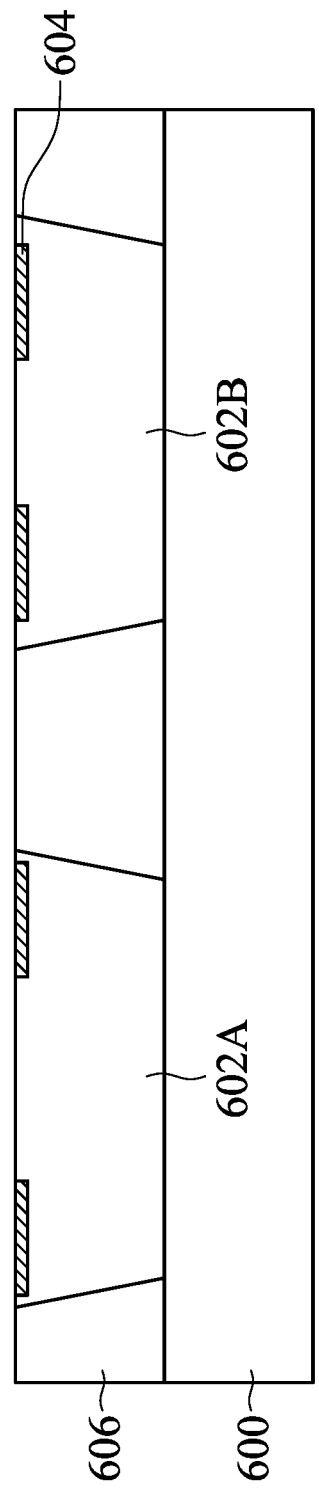

PACKAGE STRUCTURE CONTAINING CHIP STRUCTURE WITH INCLINED SIDEWALLS

This Application is a Divisional of U.S. application Ser. No. 17/459,314, filed on Aug. 27, 2021, now U.S. Pat. No. 11,978,722, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 6A-6E are cross-sectional views of various stages of a process for forming a portion of a package structure, in accordance with some embodiments.

DETAILED DESCRIPTION

Figure 1A:
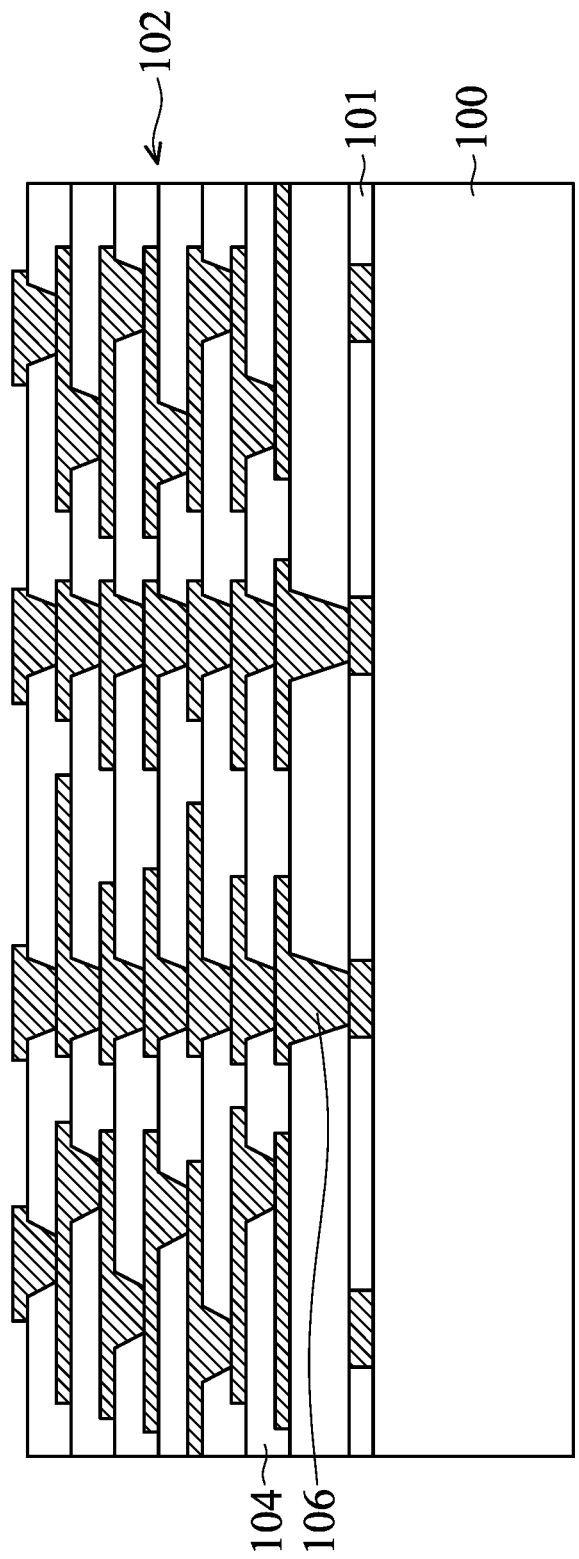
FIGS. 1A-1F are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are cross-sectional views of various stages of a process for forming a package structure, in accordance with some embodiments. As shown in FIG. 1A, a carrier substrate 100 is provided or received. The carrier substrate 100 is used as a support substrate during the fabrication process. In some embodiments, the carrier substrate 100 is a temporary support carrier and will be removed later.

The carrier substrate 100 may be made of or include a dielectric material, a semiconductor material, one or more other suitable materials, or a combination thereof. In some embodiments, the carrier substrate 100 is a dielectric substrate, such as a glass wafer. In some other embodiments, the carrier substrate 100 is a semiconductor substrate, such as a silicon wafer. The semiconductor substrate may be made of or include silicon, germanium, silicon germanium, one or more other suitable semiconductor materials, or a combination thereof.

As shown in FIG. 1A, a redistribution structure 102 is formed over the carrier substrate 100, in accordance with some embodiments. The redistribution structure 102 may include a release film 101, multiple insulating layers 104, and multiple conductive features 106. The release film 101 and the carrier substrate 100 may together be removed later.

In some embodiments, the insulating layers 104 are polymer-containing layers. The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104. These openings may be used to contain some of the conductive features 106.

The conductive features 106 may include conductive lines, conductive vias, and/or conductive pads. The conductive features 106 may be made of or include copper, cobalt, tin, titanium, gold, platinum, aluminum, tungsten, one or more other suitable materials, or a combination thereof. The conductive features 106 may be formed using an electroplating process, an electroless plating process, one or more other applicable processes, or a combination thereof. The formation of the conductive features 106 may further involve one or more etching processes.

As shown in FIG. 1A, some of the conductive features 106 in the redistribution structure 102 are conductive vias. In some embodiments, the upper portion of the conductive via is wider than the lower portion of the conductive via, as shown in FIG. 1A.

Figure 1B:
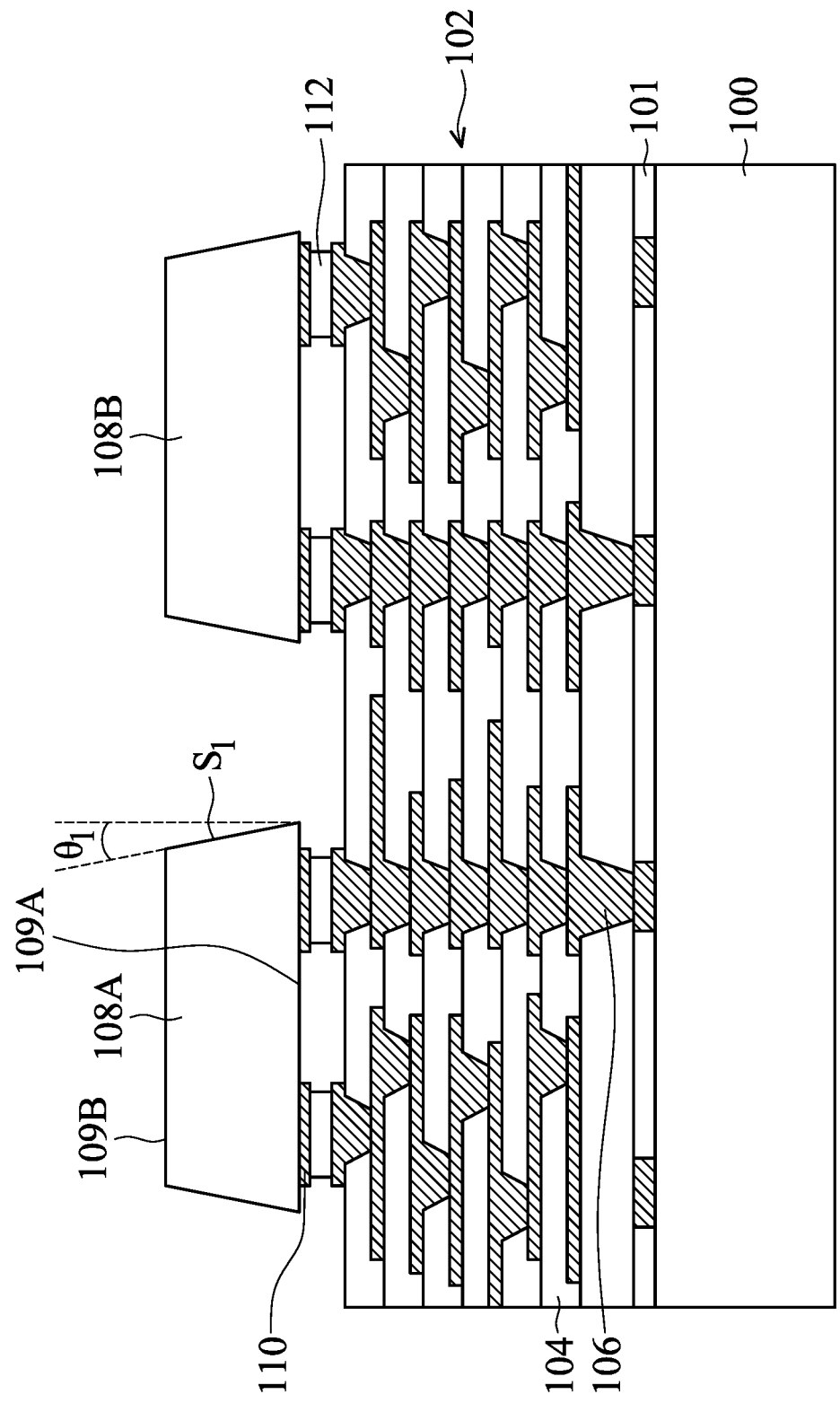

As shown in FIG. 1B, multiple chip structures (or chip-containing structures) 108A and 108B are disposed over the redistribution structure 102, in accordance with some embodiments. In some embodiments, before the chip structures 108A and 108B are disposed, a testing operation is performed to the redistribution structure 102 to ensure the quality and reliability of the redistribution structure 102.

In some embodiments, the chip structures 108A and 108B are bonded onto the conductive pads of the redistribution structure 102 through conductive connectors 112. In some embodiments, each of the chip structures 108A and 108B includes conductive pillars (or conductive pads) 110 with solder elements formed thereon. Solder elements may also be formed on the conductive pads of the redistribution structure 102. The chip structures 108A and 108B are picked and placed onto the redistribution structure 102. In some embodiments, the solder elements of the chip structures 108A and 108B and/or the solder elements on the conductive pads of the redistribution structure 102 are reflowed together. As a result, the reflowed solder elements form the conductive connectors 112.

Each of the chip structures 108A and 108B may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, the back sides of the semiconductor dies face upwards with the front sides of the semiconductor dies facing the redistribution structure 102. In some embodiments, the conductive pillars (or conductive pads) 110 are formed at the front sides.

In some embodiments, some of the semiconductor dies include memory devices such as high bandwidth memory (HBM) devices. In some embodiments, the chip structures 108A and 108B are semiconductor dies such as SoC dies. In some embodiments, each of the chip structures 108A and 108B is system-on-integrated-chips (SoIC) that includes multiple semiconductor dies that are stacked together. In some other embodiments, the chip structures 108A and 108B are packages that include one or more semiconductor dies therein.

In some embodiments, each of the chip structures 108A and 108B has one or more inclined sidewalls $S_1$, as shown in FIG. 1B. In some embodiments, the inclined sidewalls $S_1$ directly connect the front side 109A and the back side 109B of the chip structures 108A or 108B. In some embodiments, the front side 109A where the conductive pillars (or conductive pads) 110 are formed and the back side 109B have different widths. In some embodiments, the front side 109A is wider than the back side 109B, as shown in FIG. 1B.

The inclined sidewalls of the chip structures 108A and 108B may help to release or reduce stress in a subsequently formed protective layer that surrounds the chip structures 108A and 108B. As shown in FIG. 1B, the inclined sidewall $S_1$ is at an acute angle $\theta_1$ to the vertical. In some embodiments, the vertical is a direction perpendicular to a main surface of the chip structure 108A or 108B. Alternatively, the vertical is a direction perpendicular to the top surface of an underlying substrate such as the carrier substrate 100. The acute angle $\theta_1$ may be greater than about 12 degrees. The acute angle $\theta_1$ may be in a range from about 12 degrees to about 45 degrees.

In some cases, if the acute angle $\theta_1$ is smaller than about 12 degrees, the stress in the subsequently formed protective layer that surrounds the chip structures 108A and 108B may still be high. The high stress in the subsequently formed protective layer might induce the formation of defects and/or cracks in the protective layer. In some other cases, if the acute angle $\theta_1$ is greater than about 45 degrees, too much space of the chip structures 108A or 108B may be unavailable for containing device elements, which may not be desired either.

In some embodiments, each of the chip structures 108A and 108B is obtained from cutting a semiconductor wafer. In some embodiments, the chip structures 108A and 108B are obtained from cutting different semiconductor wafers. In some other embodiments, the chip structures 108A and 108B are obtained from cutting the same semiconductor wafer.

FIGS. 3A-3D are cross-sectional views of various stages of a process for forming a portion of a package structure, in accordance with some embodiments. In some embodiments, FIGS. 3A-3D show the cutting process for obtaining the chip structures 108A and/or 108B.

Figure 3A:
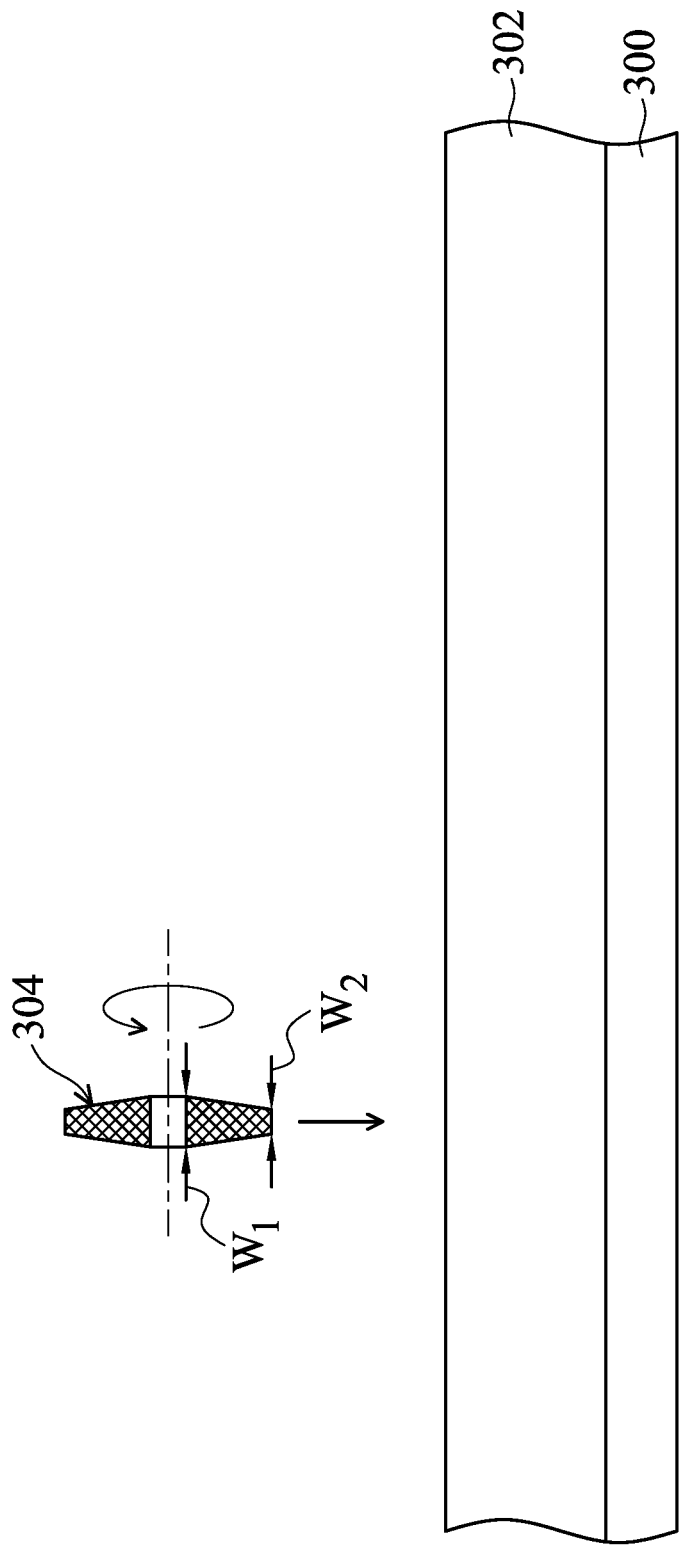
FIGS. 3A-3D are cross-sectional views of various stages of a process for forming a portion of a package structure, in accordance with some embodiments.

As shown in FIG. 3A, a semiconductor wafer 302 is attached on a carrier 300 and is to be cut using a dicing saw 304, in accordance with some embodiments. The dicing saw 304 may be used to cut the predetermined dicing regions (or the predetermined scribe lines), so as to separate the semiconductor wafer 302 into multiple semiconductor chips. The dicing saw 304 has a rotational axis that is used to rotate the blade of the dicing saw 304. In some embodiments, the dicing saw 304 gradually becomes thicker along a direction from an edge of the dicing saw 304 towards an inner portion of the dicing saw 304. As shown in FIG. 3A, the dicing saw 304 has inclined sidewalls. The dicing saw 304 has a first width $W_1$ near the rotational axis of the dicing saw 304 and a second width $W_2$ at the edge of the dicing saw 304. The first width W is greater than the second width $W_2$. The dicing saw 304 may be moved towards the semiconductor wafer 302 to cut a first predetermined dicing region of the semiconductor wafer 302.

Figure 3B:
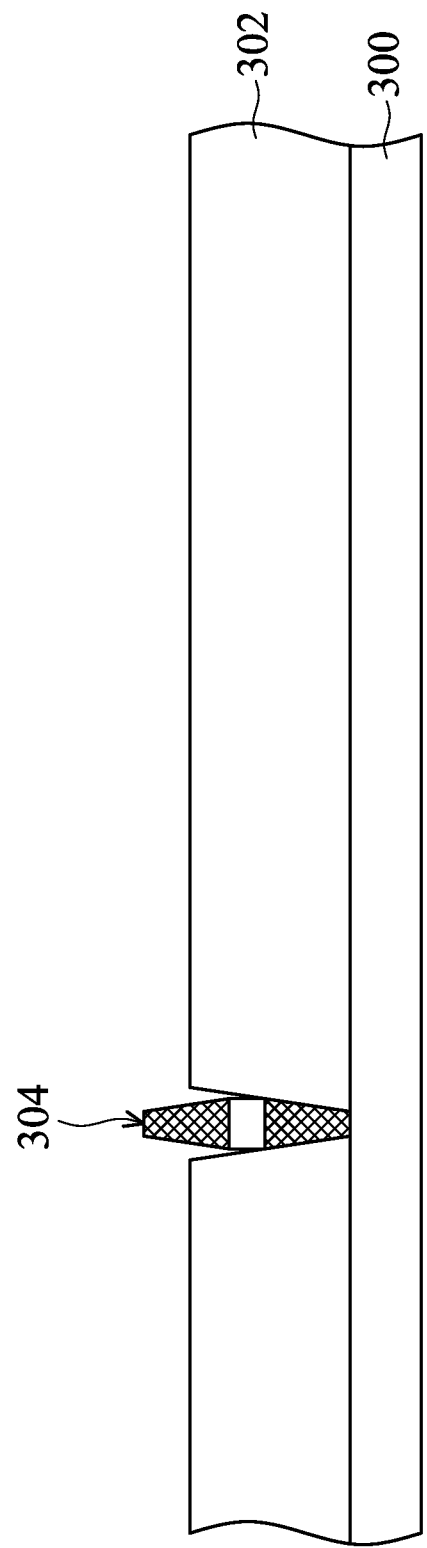

As shown in FIG. 3B, a portion of the semiconductor wafer 302 is removed by the dicing saw 304, in accordance with some embodiments. In some embodiments, the dicing saw 304 cut through the semiconductor wafer 302. The dicing saw 304 may be stopped when the carrier 300 is reached by the dicing saw 304.

Figure 3C:
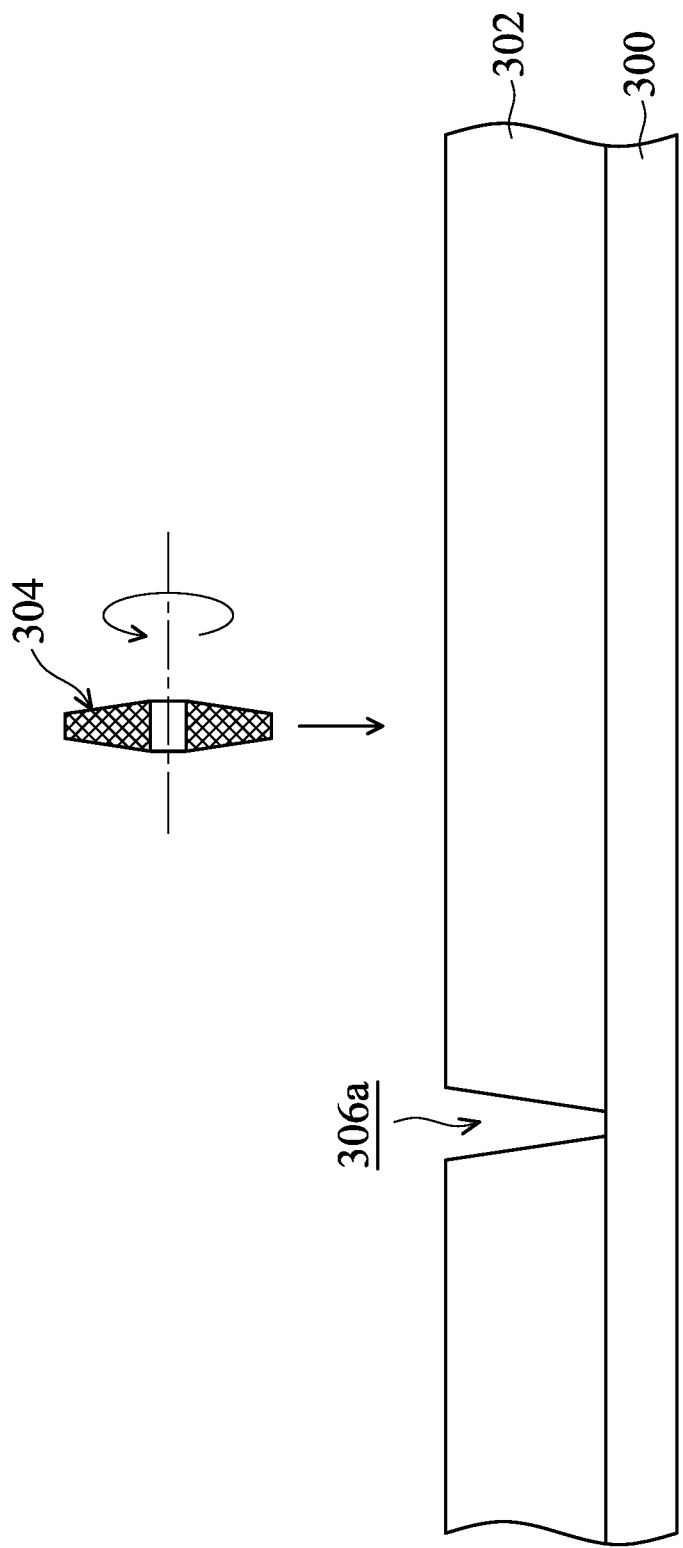

As shown in FIG. 3C, the dicing saw 304 is moved upwards and moved over a second predetermined dicing region of the semiconductor wafer 302, in accordance with some embodiments. The dicing saw 304 may then be moved towards the semiconductor wafer 302 to cut the second predetermined dicing region of the semiconductor wafer 302. As shown in FIG. 3C, after cut by the dicing saw 304, a trench 306a is formed. Due to the profile of the dicing saw 304, the trench 306a has inclined sidewalls.

Figure 3D:
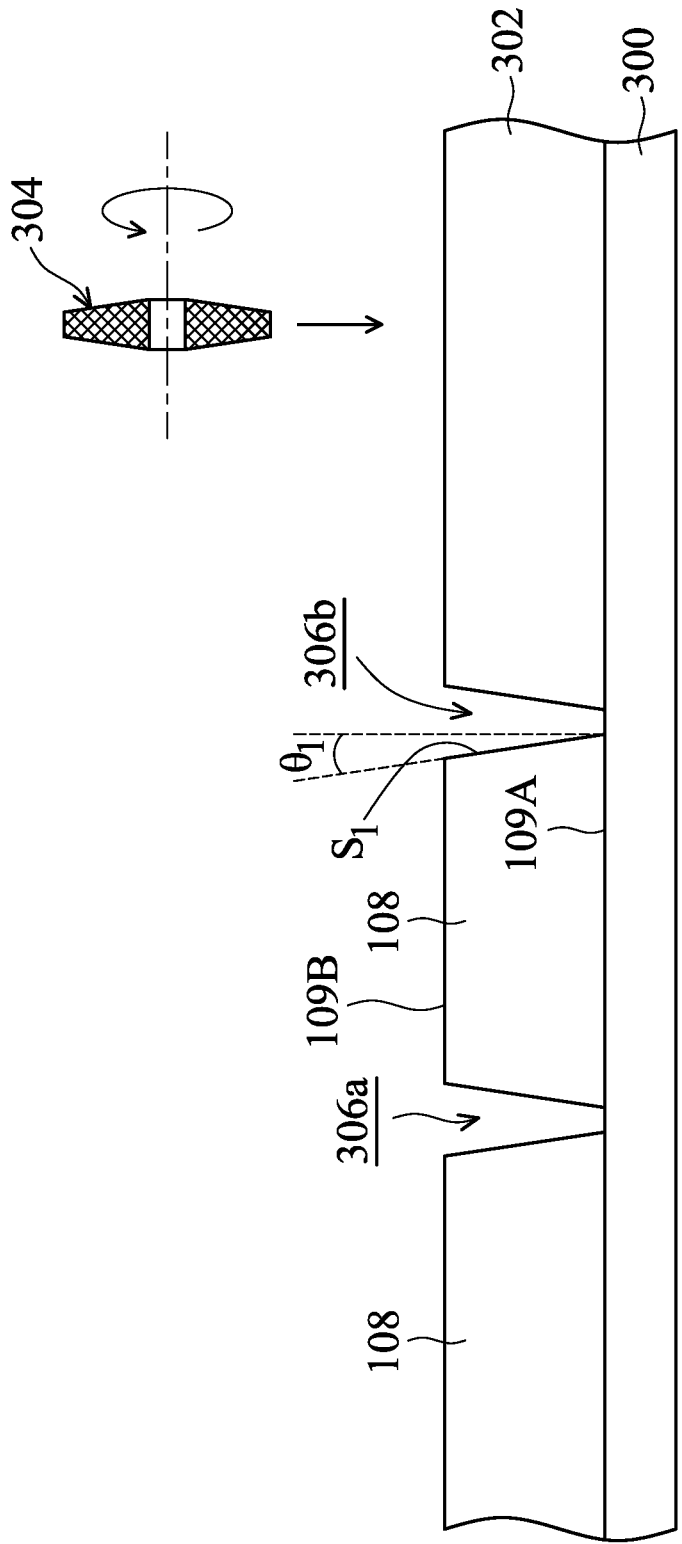

As shown in FIG. 3D, the dicing saw 304 is moved upwards and moved over a third predetermined dicing region of the semiconductor wafer 302, in accordance with some embodiments. The dicing saw 304 may then be moved towards the semiconductor wafer 302 to cut the third predetermined dicing region of the semiconductor wafer 302. As shown in FIG. 3D, after cut by the dicing saw 304, a trench 306b is formed. Due to the profile of the dicing saw 304, the trench 306b has inclined sidewalls.

In some embodiments, after subsequent cutting processes, more trenches (not shown) intersecting the trenches 306a and 306b are formed. As a result, chip structure 108 each separated from other portions of the semiconductor wafer 302 are obtained. The chip structure 108 may be detached from the carrier 300 and be used as the chip structure 108A or 108B in FIG. 1B. Each of the chip structures 108 has an inclined sidewall $S_1$ extending between the front side 109A and the back side 109B of the chip structure 108. The inclined sidewall $S_1$ is at an acute angle $\theta_1$ to the vertical. The acute angle $\theta_1$ may be greater than about 12 degrees. The acute angle $\theta_1$ may be in a range from about 12 degrees to about 45 degrees.

Figure 9:
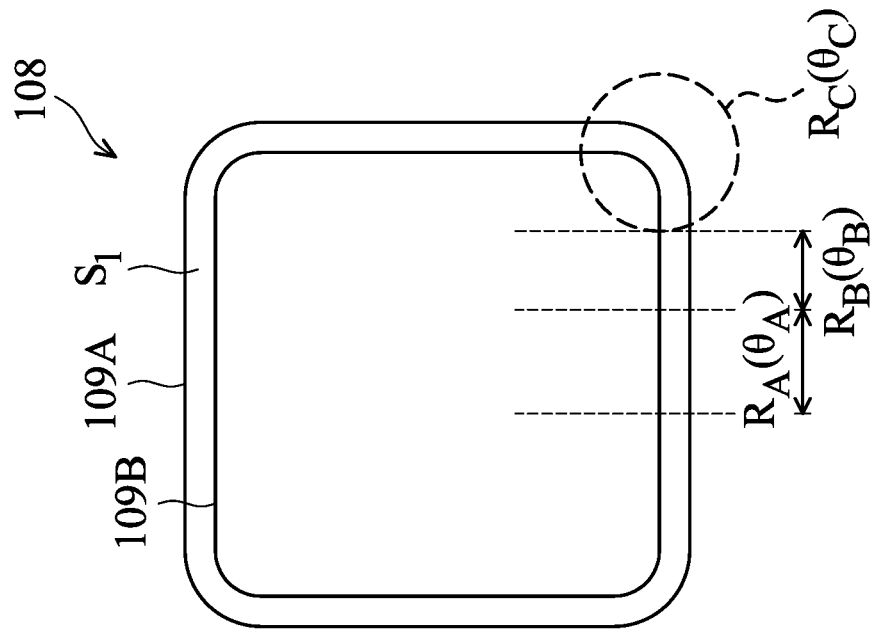
FIG. 9 is a top view of a chip structure, in accordance with some embodiments.

FIG. 9 is a top view of a chip structure, in accordance with some embodiments. In some embodiments, FIG. 9 shows the top view of the chip structure 108 shown in FIG. 3D. The top view of the chip structure 108 may be the same as or similar to the top view of the chip structure 108A or 108B shown in FIG. 1B.

As shown in FIG. 9, the inclined sidewall $S_1$ connects the front side 109A and the back side 109B of the chip structure 108. In the top view of the chip structure 108, the chip structure 108 has a first region $R_A$, a second region $R_B$, and a corner region $R_C$. The second region $R_B$ is positioned between the first region $R_A$ and the corner region $R_C$. In some embodiments, the inclined sidewall $S_1$ within the first region $R_A$ has an acute angle $\theta_A$ to the vertical, the second region $R_B$ has an acute angle $\theta_B$ to the vertical, and the corner region $R_C$ has an acute angle $\theta_C$ to the vertical. Each of the acute angles $\theta_A$, $\theta_B$, and $\theta_C$ may be greater than about 12 degrees. Each of the acute angles $\theta_A$, $\theta_B$, and $\theta_C$ may be in a range from about 12 degrees to about 45 degrees. In some embodiments, the acute angles $\theta_A$, $\theta_B$, and $\theta_C$ in these regions $R_A$, $R_B$, and $R_C$ are substantially equal to each other.

However, embodiments of the disclosure are not limited thereto. Many variations and/or modifications can be made to embodiments of the disclosure. In some other embodiments, the acute angles $\theta_A$, $\theta_B$, and $\theta_C$ in these regions $R_A$, $R_B$, and $R_C$ are different from each other. In some embodiments, the acute angles $\theta_C$ is greater than the acute angle $\theta_B$, and the acute angle $\theta_B$ is greater than the acute angle $\theta_A$. In some embodiments, the inclined sidewall $S_1$ in the first region $R_A$ is steeper than the inclined sidewall $S_1$ in the second region $R_B$, and the inclined sidewall $S_1$ in the second region $R_B$ is steeper than the inclined sidewall $S_1$ in the corner region $R_C$. The acute angle $\theta_A$ may be in a range from about 12 degrees to about 20 degrees. The acute angle $\theta_B$ may be in a range from about 15 degrees to about 25 degrees. The acute angle $\theta_C$ may be in a range from about 20 degrees to about 45 degrees. In some embodiments, the inclined sidewall near the corner region $R_C$ may help to reduce the molding stress around 7% to 10% in the subsequently formed protective layer.

In some embodiments, different dicing saws are used to cut different portions of a semiconductor wafer for forming the chip structure 108. As a result, different portions of the chip structure 108 may have included sidewalls that have different acute angles to the vertical.

Alternatively, in some other embodiments, the chip structure 108 may be partially removed using one or more photolithography processes and one or more etching processes. As a result, different portions of the chip structure 108 may have inclined sidewalls that have different acute angles to the vertical.

Figure 10:
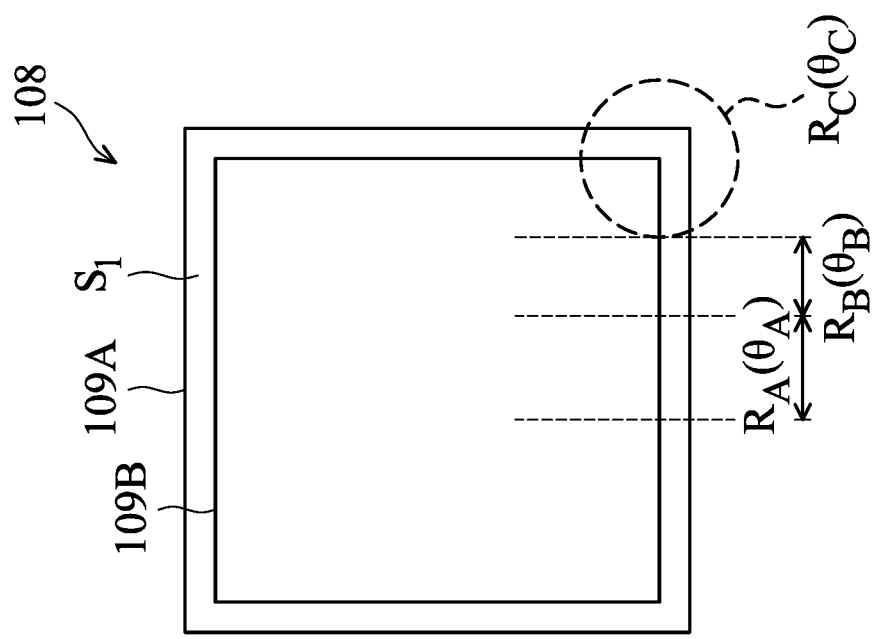
FIG. 10 is a top view of a chip structure, in accordance with some embodiments.

Many variations and/or modifications can be made to embodiments of the disclosure. FIG. 10 is a top view of a chip structure, in accordance with some embodiments. In some embodiments, FIG. 10 shows the top view of the chip structure 108 shown in FIG. 3D. The top view of the chip structure 108 may be the same as or similar to the top view of the chip structure 108A or 108B shown in FIG. 1B.

As shown in FIG. 10, similar to the embodiments illustrated in FIG. 9, the chip structure 108 has the first region $R_A$, the second region $R_B$, and the corner region $R_C$. In some embodiments, the top view of the corner region $R_C$ has a rounded profile. The rounded profile may help to further reduce the corner stress. The corner region $R_C$ may be modified using a dicing saw to form the rounded profile. Alternatively, one or more photolithography processes and one or more etching processes may be used to form the rounded profile of the corner region $R_C$.

As shown in FIG. 10, similar to the embodiments illustrated in FIG. 9, the inclined sidewalls $S_1$ in different regions are at the respective acute angles to the vertical. In some embodiments, the acute angles $\theta_A$, $\theta_B$, and $\theta_C$ in the regions $R_A$, $R_B$, and $R_C$ are substantially equal to each other. In some other embodiments, the acute angles $\theta_A$, $\theta_B$, and $\theta_C$ in these regions $R_A$, $R_B$, and $R_C$ are different from each other. In some embodiments, the acute angles $\theta_C$ is greater than the acute angle $\theta_B$, and the acute angle $\theta_B$ is greater than the acute angle $\theta_A$. In some embodiments, the inclined sidewall $S_1$ in the first region $R_A$ is steeper than the inclined sidewall $S_1$ in the second region $R_B$, and the inclined sidewall $S_1$ in the second region $R_B$ is steeper than the inclined sidewall $S_1$ in the corner region $R_C$.

Figure 1C:
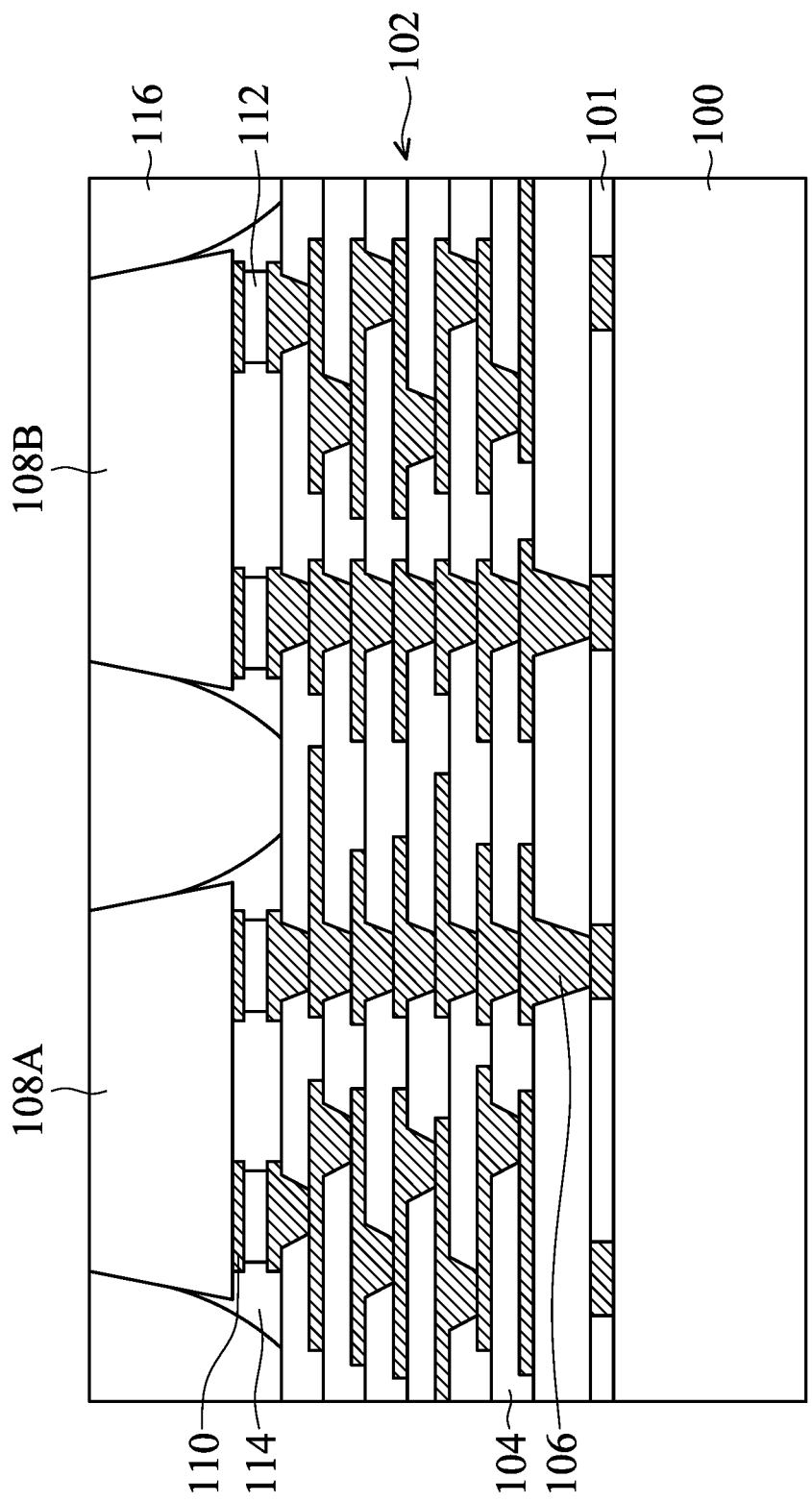

Referring to FIG. 1C, an underfill material 114 is formed to surround and protect the conductive connectors 112, in accordance with some embodiments. The underfill material 114 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 116 is formed over the redistribution structure 102 to surround and protect the chip structures 108A and 108B, as shown in FIG. 1C in accordance with some embodiments. In some embodiments, the protective layer 116 is in direct contact with the redistribution structure 102. In some embodiments, the protective layer 116 is in direct contact with the inclined sidewalls of the chip structures 108A and 108B. In some embodiments, the protective layer 116 is separated from the conductive connectors 112 below the chip structures 108A and 108B by the underfill material 114.

However, embodiments of the disclosure are not limited thereto. Many variations and/or modifications can be made to embodiments of the disclosure. In some other embodiments, the underfill material 114 is not formed. In these cases, the protective layer 116 may be in direct contact with the conductive connectors 112 below the chip structures 108A and 108B.

In some embodiments, the protective layer 116 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 116 is greater than the distribution density of the fillers in the underfill material 114. In some embodiments, the weight percentage of the fillers in the protective layer 116 is greater than the weight percentage of the fillers in the underfill material 114. The profiles, sizes, and/or materials of the fillers in the protective layer 116 and the underfill material 114 may be different from each other.

In some embodiments, a molding material (such as a liquid molding material) is introduced or injected to cover the redistribution structure 102 and the chip structures 108A and 108B. In some embodiments, a thermal molding process is then used to cure the liquid molding material and to transform it into the protective layer 116. In some embodiments, a planarization process is performed to the protective layer 116 to improve the flatness of the protective layer 116. For example, the planarization process may include a grinding process, a CMP process, a dry polishing process, one or more other applicable processes, or a combination thereof. In some embodiments, after the planarization process, the top surface of the protective layer 116 is substantially level with the surfaces of the chip structures 108A and 108B.

Due to the inclined sidewalls of the chip structures 108A and 108B, more available space around the chip structures 108A and 108B is provided. A greater amount of the molding material is allowed to be formed around the chip structures 108A and 108B. The molding material may function like a buffer component during the thermal molding process for forming the protective layer 116. The molding stress may thus be released and/or reduced. The reliability and performance of the package structure are greatly improved.

Figure 1D:
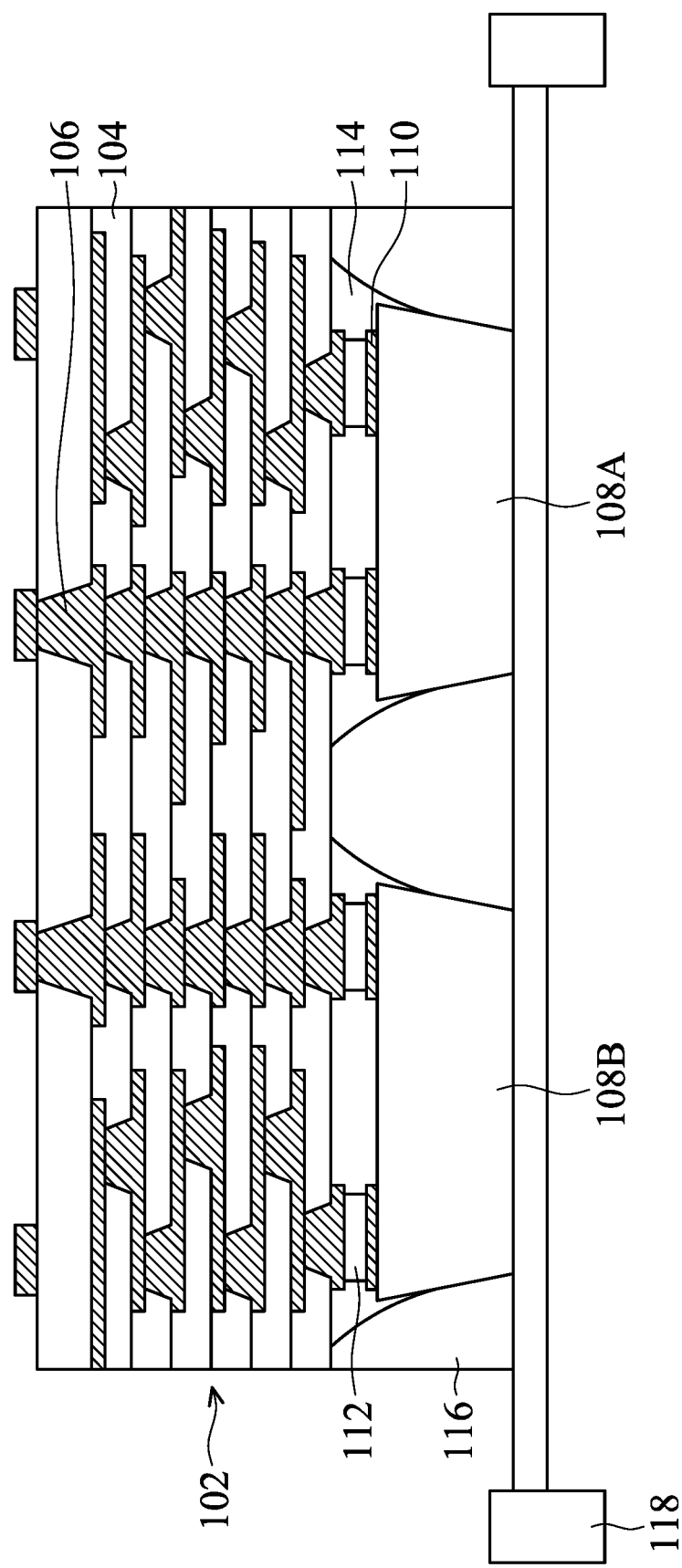

Afterwards, the structure shown in FIG. 1C is flipped upside down and attached onto a carrier tape 118, in accordance with some embodiments. Afterwards, the carrier substrate 100 and the release film 101 are removed, as shown in FIG. 1D in accordance with some embodiments. As a result, the surface of the redistribution structure 102 that is originally covered by the carrier substrate 100 is exposed.

Figure 1E:
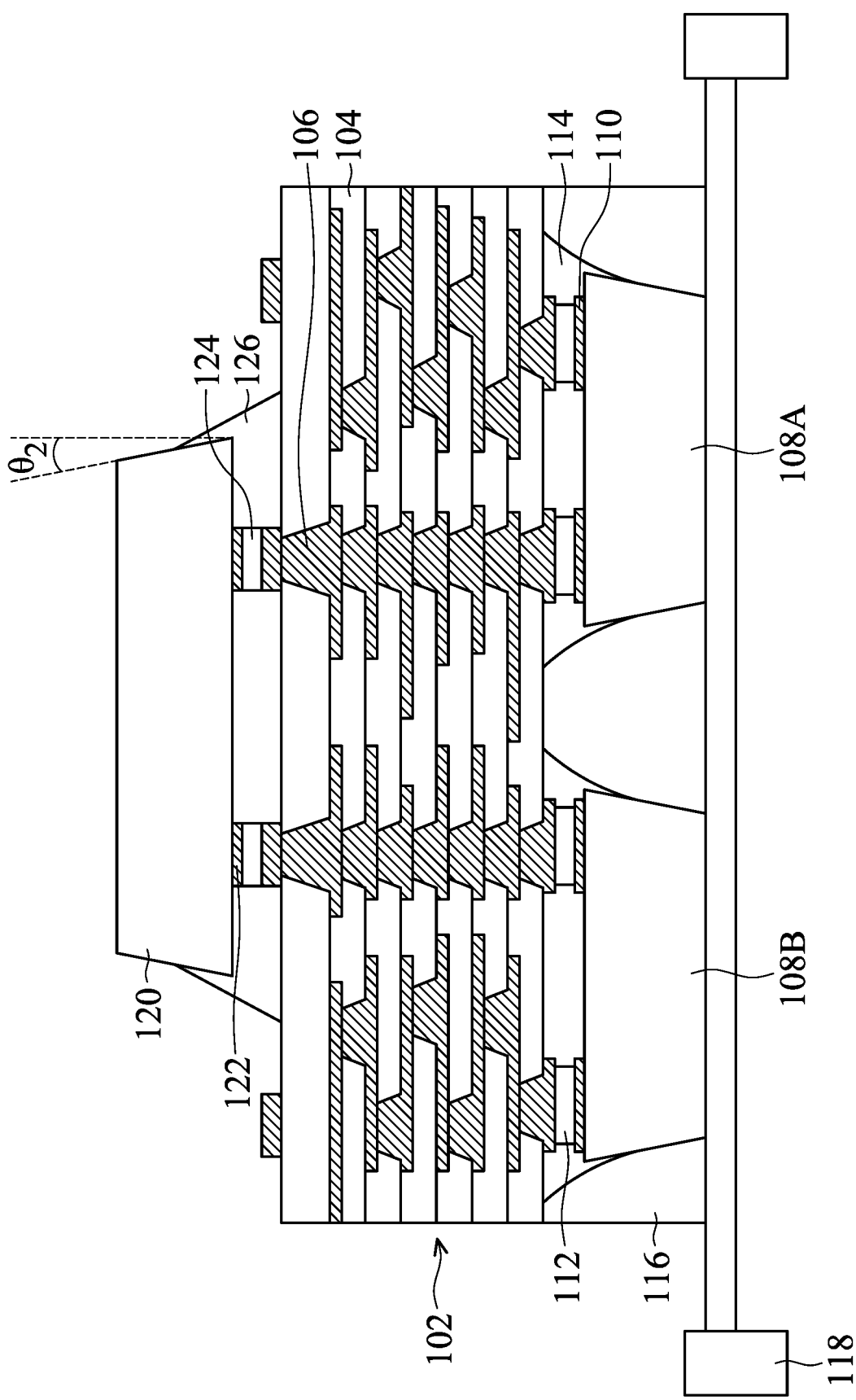

As shown in FIG. 1E, one or more chip structures (or chip-containing structures) 120 are bonded to the redistribution structure 102 through conductive connectors 124, in accordance with some embodiments. The material and formation method of the conductive connectors 124 may be the same as or similar to those of the conductive connectors 112. Through the conductive connectors 124, electrical connections are formed between the conductive pillars (or conductive pads) 122 of the chip structure 120 and some of the conductive features 106 of the redistribution structure 102. In some embodiments, the chip structure 120 forms electrical connections between the chip structures 108A and 108B through some of the conductive features 106 of the redistribution structure 102, as shown in FIG. 1E.

The chip structure 120 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 120 is an interconnection die that receive and/or transfer electrical signals to and/or from the chip structures 108A and 108B. In some embodiments, the chip structure 120 has no active devices formed therein. In some other embodiments, the chip structure 120 includes active devices and passive devices formed therein. In some other embodiments, a surface mounted device is used to replace the chip structure 120. The surface mounted device may include, for example, resistors, capacitors, insulators, one or more other suitable devices, or a combination thereof.

In some embodiments, similar to the chip structures 108A and 108B, the chip structure 120 has one or more inclined sidewalls, as shown in FIG. 1E. As shown in FIG. 1E, the inclined sidewall of the chip structure 120 is at an acute angle $\theta_2$ to the vertical. In some embodiments, the acute angle $\theta_2$ is greater than about 12 degrees. In some embodiments, the acute angle $\theta_2$ is in a range from about 12 degrees to about 45 degrees. In some embodiments, the top view of the chip structure 120 is the same as or similar to that shown in FIG. 9. In some other embodiments, the top view of the chip structure 120 is the same as or similar to that shown in FIG. 10.

However, embodiments of the disclosure are not limited thereto. Many variations and/or modifications can be made to embodiments of the disclosure. In some embodiments, the chip structure 120 does not have inclined sidewalls. In some embodiments, the chip structure 120 has vertical sidewalls.

As shown in FIG. 1E, an underfill material 126 is formed over the redistribution structure 102 to surround the conductive connectors 124, in accordance with some embodiments. The material and formation method of the underfill material 126 may be the same as or similar to those of the underfill material 114. Many variations and/or modifications can be made to embodiments of the disclosure. In some other embodiments, the underfill material 126 is not formed.

Figure 1F:
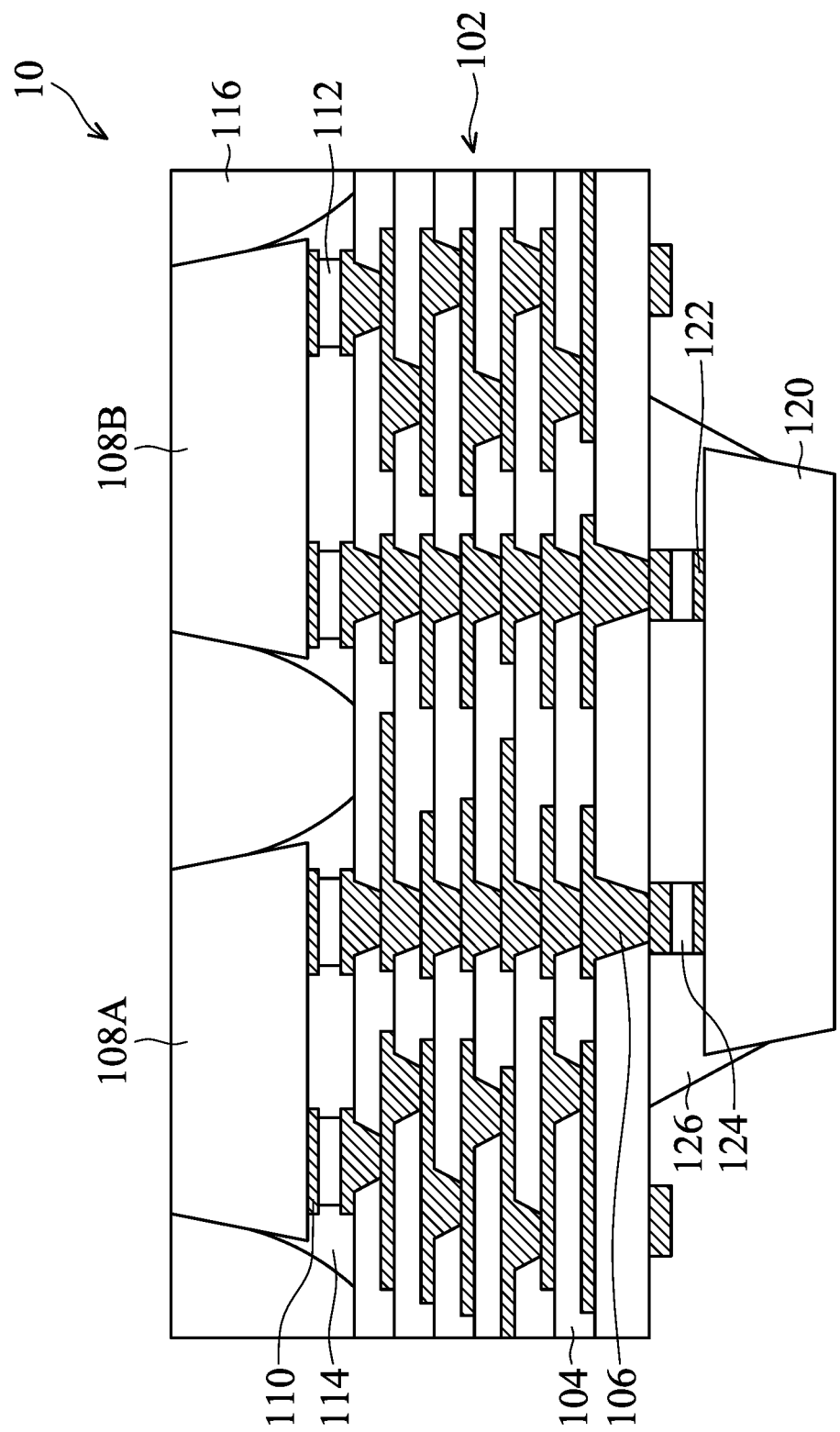

In some embodiments, a sawing process is used to cut through the structure shown in FIG. 1E into multiple separate die packages. After the sawing process, one die package 10 is picked from the carrier tape 118 and turned upside down, as shown in FIG. 1F in accordance with some embodiments. The die package 10 is to be integrated with other elements to form a larger package structure.

However, embodiments of the disclosure are not limited thereto. Many variations and/or modifications can be made to embodiments of the disclosure. In some other embodiments, the sawing process is not performed to separate the structure in FIG. 1E into multiple smaller die packages. The entirety of the wafer-level package structure may directly be integrated into a large package structure without being sawed.

Figure 2A:
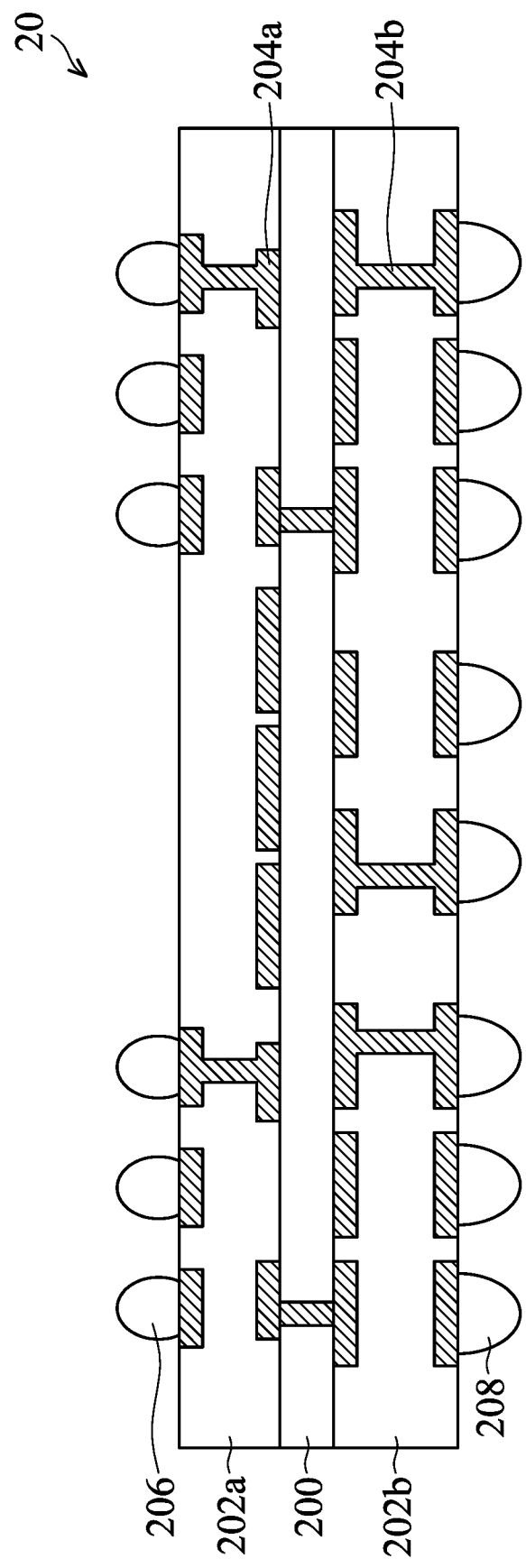
FIGS. 2A-2D are cross-sectional views of various stages of a process for forming a portion of a package structure, in accordance with some embodiments.

FIGS. 2A-2D are cross-sectional views of various stages of a process for forming a portion of a package structure, in accordance with some embodiments. As shown in FIG. 2A, a circuit substrate (or a package substrate) 20 is received or provided. In some embodiments, the circuit substrate 20 includes a core portion 200. The circuit substrate 20 may further includes multiple insulating layers 202a and 202b and multiple conductive features 204a and 204b. The conductive features 204a and 204b may be used to route electrical signals between opposite sides of the circuit substrate 20. The insulating layers 202a and 202b may be made of or include one or more polymer materials. The conductive features 204a and 204b may be made of or include copper, aluminum, cobalt, tungsten, gold, one or more other suitable materials, or a combination thereof.

The core portion 200 may include organic materials such as materials that can be easily laminated. In some embodiments, the core portion 200 may include a single-sided or double-sided copper clad laminate, epoxy, resin, glass fiber, molding compound, plastic (such as polyvinylchloride (PVC), acrylonitril, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof. Conductive vias may extend through the core portion 200 to provide electrical connections between elements disposed on either side of the core portion 200. In some embodiments, the circuit substrate 20 further includes bonding structures 206 and 208. In some embodiments, the bonding structures 206 and 208 are solder bumps. In some embodiments, the bonding structures 208 are used for bonding with another element such as a printed circuit board.

In some embodiments, the circuit board 20 has a predetermined region where no conductive feature is formed. The predetermined region will be partially removed to form one or more recesses later.

Figure 2B:
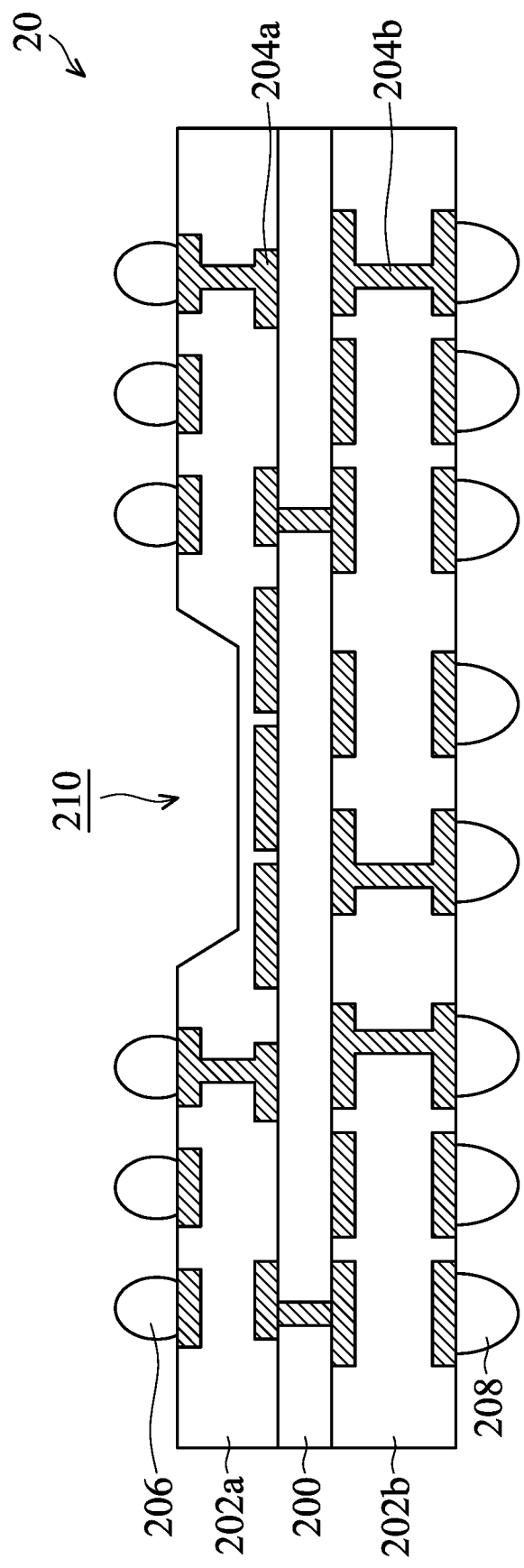

As shown in FIG. 2B, the predetermined region of the circuit substrate 20 is partially removed to form a recess 210, in accordance with some embodiments. After the partial removal of the circuit substrate 20, interior sidewalls of the circuit substrate 20 are formed. The interior sidewalls of the circuit substrate 20 form the sidewalls of the recess 210, as shown in FIG. 2B.

In some embodiments, the recess 210 is formed using an energy beam drilling process. The energy beam drilling process may include a laser beam drilling process, an ion beam drilling process, an electron beam drilling process, one or more other applicable processes, or a combination thereof. The energy beam drilling process may be performed multiple times to different regions of the circuit substrate 20. As a result, the recess 210 with the designed profile is formed. In some other embodiments, the recess 210 is formed using a mechanical drilling process. For example, a computer numerical control (CNC) engraving machine may be used to form the recess 210. In some other embodiments, one or more photolithography processes and one or more etching processes are used to partially remove the circuit substrate 20, so as to form the recess 210. In some other embodiments, the circuit substrate 20 is partially removed using an energy beam drilling process, a mechanical drilling process, an etching process, one or more other applicable processes, or a combination thereof.

Figure 2C:
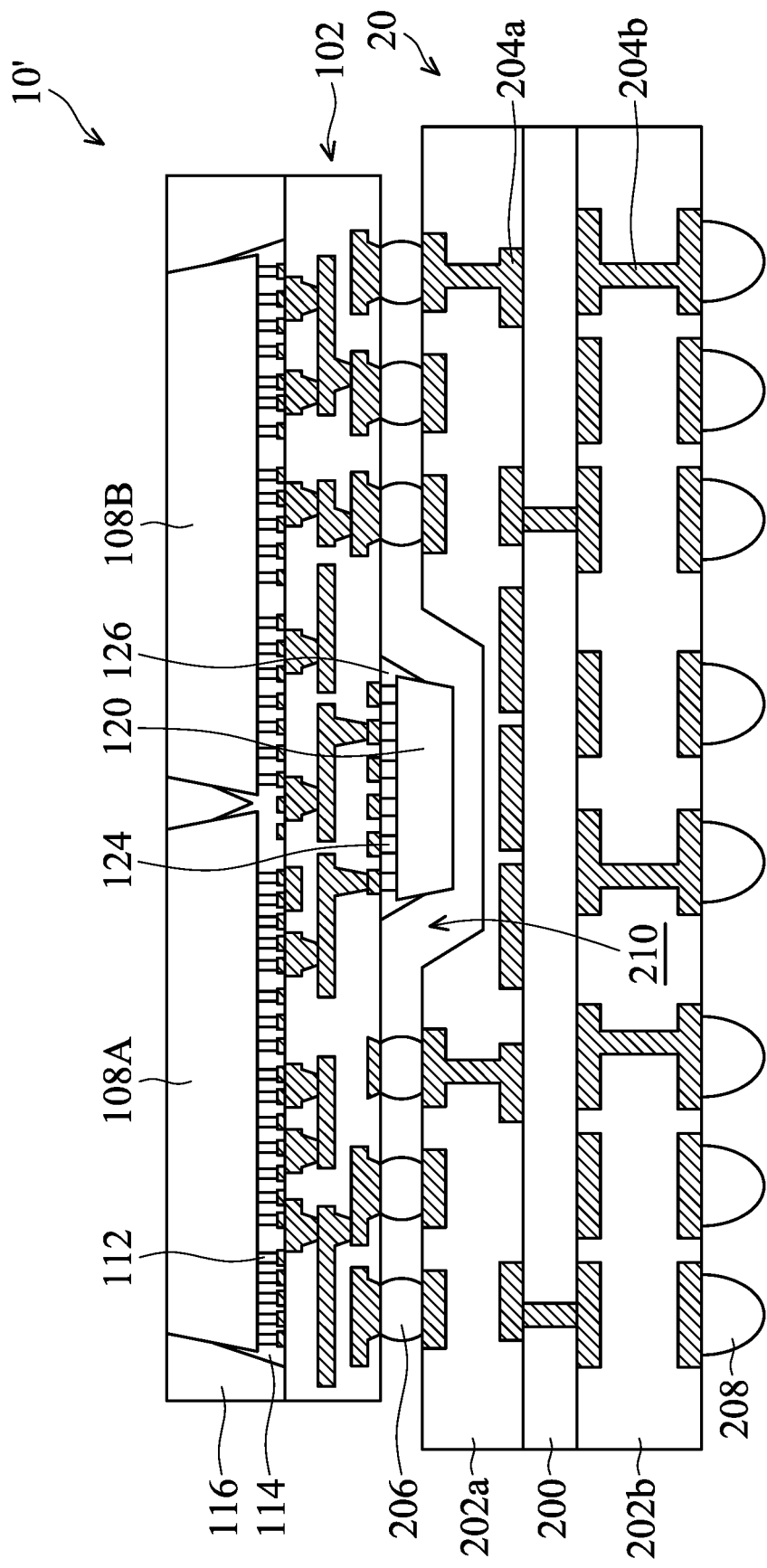

As shown in FIG. 2C, a die package 10' that is the same as or similar to the die package 10 shown in FIG. 1F is received or provided. In some embodiments, the die package 10' is picked and placed over the circuit substrate 20. Afterwards, the die package 10' is bonded to the circuit substrate 20 through the bonding structures 206.

In some embodiments, the die package 10' is disposed over the circuit substrate 20 such that the conductive pads of the redistribution structure 102 are in direct contact with the bonding structures 206. In some other embodiments, additional solder elements may be formed on the conductive pads of the redistribution structure 102 before the die package 10' is disposed over the circuit substrate 20. Afterwards, a thermal reflow process and/or a thermal compression process are used to bond the die package 10' to the circuit substrate 20. As a result, a component (such as the chip structure 120) of the die package 10' enters the recess 210, as shown in FIG. 2C. The recess 210 provides a space for partially containing the component of the die package 10'. The total height of the package structure may thus be reduced further. In some other embodiments, the component of the die package entering the recess 210 is a surface mounted device that includes, for example, resistors, capacitors, insulators, one or more other suitable devices, or a combination thereof.

Figure 2D:
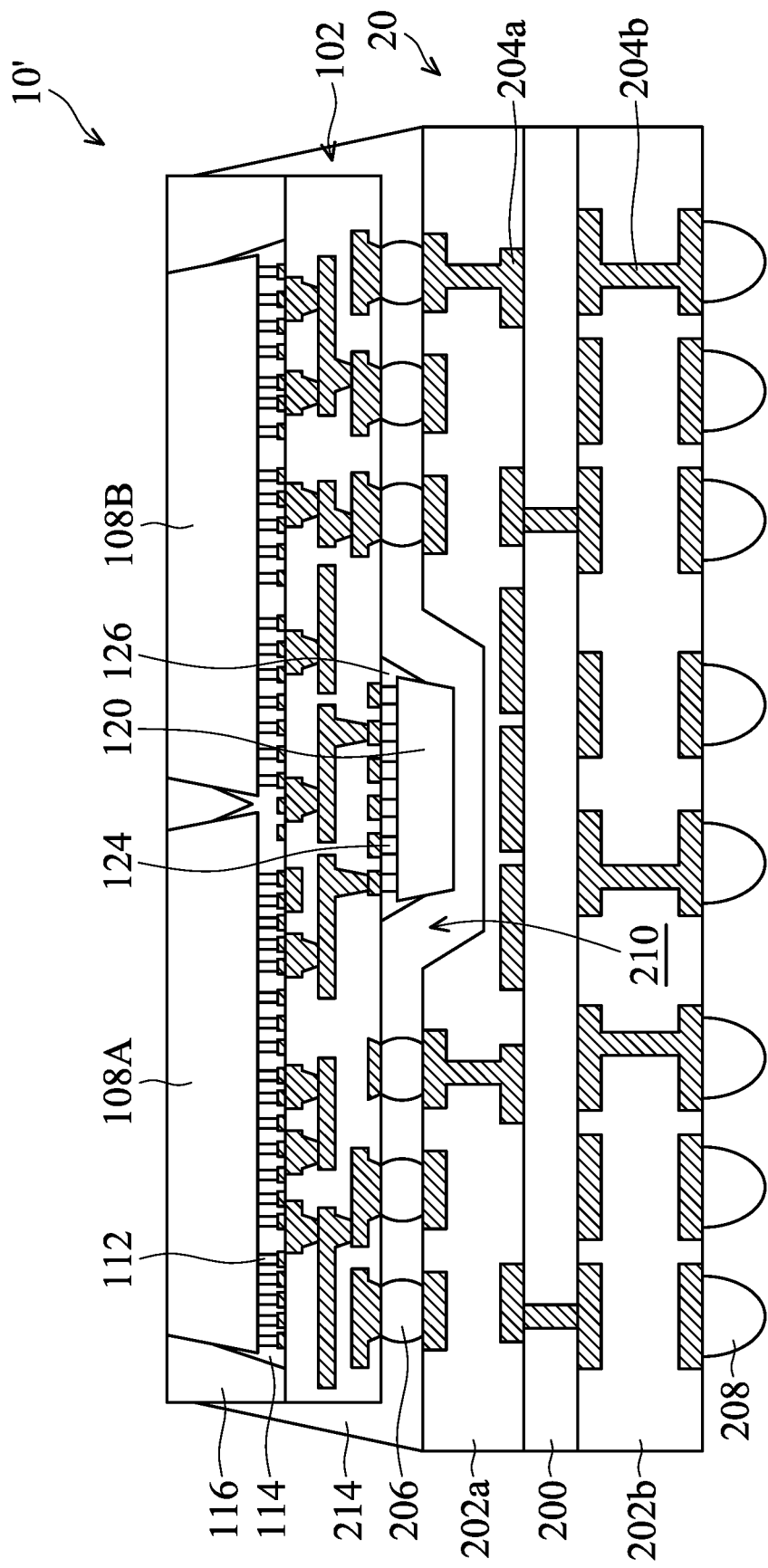

As shown in FIG. 2D, an underfill material 214 that surrounds the bonding structures 206 and fills the recess 210 is formed, in accordance with some embodiments. In some embodiments, an underfill liquid is dispensed onto the circuit substrate 20 along a side of the die package 10', in accordance with some embodiments. The underfill liquid may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

The underfill liquid may be drawn into the space between the die package 10' and the circuit substrate 20. The underfill liquid is further drawn into the recess 210 and reaching another side of the die package 10' by the capillary force. As a result, the underfill liquid forms the underfill material 214 that surrounds the bonding structures 206 and fills the recess 210. A thermal curing operation may be used to harden the underfill material 214. In some embodiments, the underfill material 214 is in direct contact with the interior sidewalls of the circuit substrate 20. In some embodiments, the topmost point of the underfill material 214 is higher than the topmost point of the underfill material 114, as shown in FIG. 2D.

Due to the inclined sidewalls of the chip structure 120, more available space around the chip structure 120 is provided. A greater amount of the underfill material 214 is allowed to be formed around the chip structure 120. The underfill material 214 may function like a buffer component around the chip structure 120. The stress may thus be released and/or reduced in the underfill material 214. The reliability and performance of the package structure are greatly improved.

In some embodiments, the inclined sidewalls of the chip structure 108A, 108B, or 120 directly connects the front side and the back side of the respective chip structure 108A, 108B, or 120. However, embodiments of the disclosure are not limited thereto. Many variations and/or modifications can be made to embodiments of the disclosure. In some other embodiments, the inclined sidewall does not directly connect the front side and the back side of the chip structure 120. In some embodiments, a vertical sidewall of the chip structure directly connects the bottom edge of the inclined sidewall. The chip structure having the combination of the inclined sidewall and the vertical sidewall may be obtained using a suitable cutting process similar to that illustrated in FIGS. 3A-3D.

FIGS. 4A-4F are cross-sectional views of various stages of a process for forming a portion of a package structure, in accordance with some embodiments. In some embodiments, FIGS. 4A-4F show the cutting process for obtaining the chip structure having the combination of the inclined sidewall and the vertical sidewall.

Figure 4A:
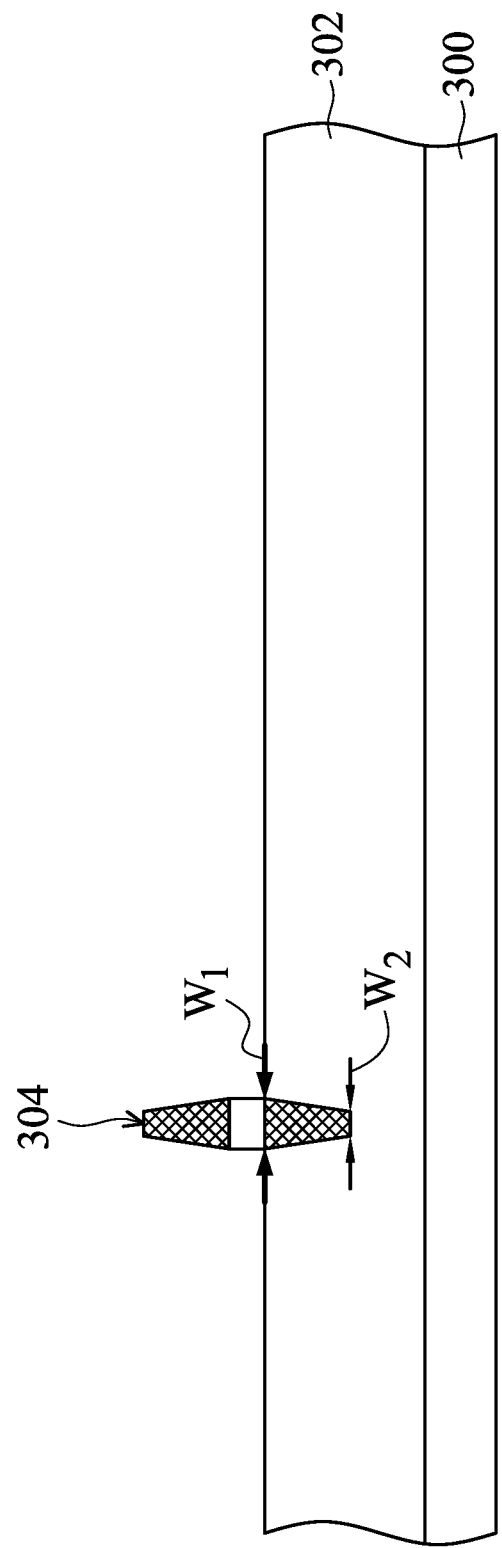
FIGS. 4A-4F are cross-sectional views of various stages of a process for forming a portion of a package structure, in accordance with some embodiments.

As shown in FIG. 4A, similar to the embodiments illustrated in FIGS. 3A and 3B, the dicing saw 304 is moved towards the semiconductor wafer 302 to cut a first predetermined dicing region of the semiconductor wafer 302. As shown in FIG. 4A, an upper portion of the semiconductor wafer 302 is cut using the dicing saw 304. Unlike the embodiments illustrated in FIG. 3B, the dicing saw 304 does not completely cut through the semiconductor wafer 302 to reach the carrier 300. The dicing saw 304 is stopped after a predetermined cutting depth is reached.

Figure 4B:
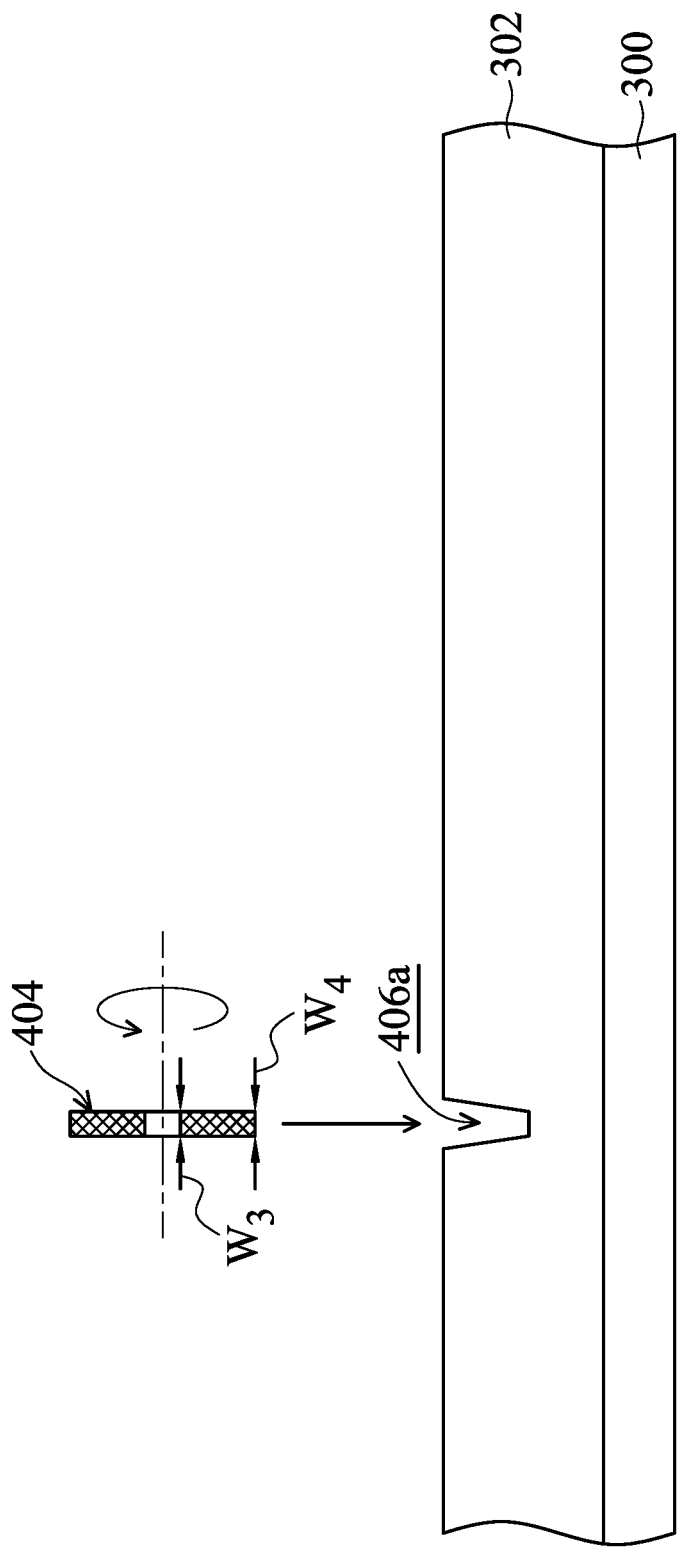

Afterwards, the dicing saw 304 is moved upwards. As shown in FIG. 4B, because of the cutting of the dicing saw 304, a trench 406a is formed in the semiconductor wafer 302, in accordance with some embodiments. Due to the profile of the dicing saw 304, the trench 406a has inclined sidewalls. As shown in FIG. 4B, another dicing saw 404 is moved over the trench 406a to continue the subsequent cutting process. The dicing saw 404 may then be moved towards the semiconductor wafer 302 to cut a lower portion of the semiconductor wafer 302, so as to deepen the trench 406a.

Similar to the dicing saw 304, the dicing saw 404 has a rotational axis that is used to rotate the blade of the dicing saw 404. In some embodiments, the blade of the dicing saw 404 has vertical sidewalls. The dicing saw 304 has a width $W_3$ near the rotational axis of the dicing saw 404 and a width $W_4$ at the edge of the dicing saw 404. In some embodiments, the width $W_3$ is substantially equal to the width $W_4$. In some embodiments, the width $W_3$ of the dicing saw 404 is shorter than the width $W_1$ of the dicing saw 304. In some embodiments, the width $W_3$ of the dicing saw 404 is substantially equal to the width $W_2$ of the dicing saw 304. In some other embodiments, the width $W_3$ of the dicing saw 404 is slightly greater than the width $W_2$ of the dicing saw 304. In some other embodiments, the width $W_3$ of the dicing saw 404 is slightly shorter than the width $W_2$ of the dicing saw 304. The ratio ($W_3/W_2$) of the width $W_3$ to the width $W_2$ may be in a range from about 0.95 to about 1.05.

Figure 4C:
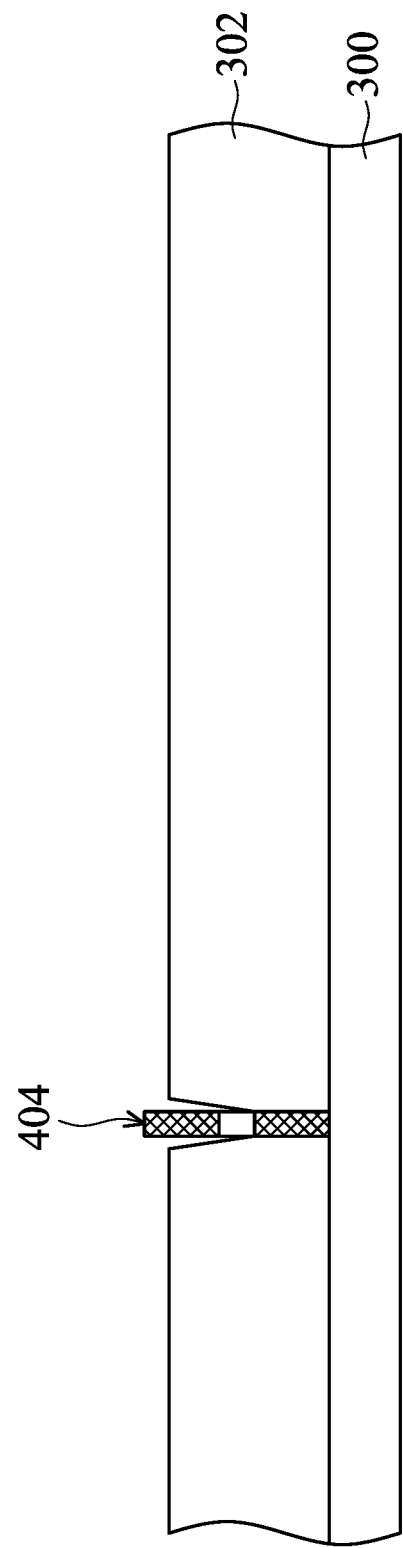

As shown in FIG. 4C, the lower portion of the semiconductor wafer 302 under the trench 406 is removed by the dicing saw 404, in accordance with some embodiments. In some embodiments, the dicing saw 404 cut through the semiconductor wafer 302. The dicing saw 404 may be stopped when the carrier 300 is reached by the dicing saw 404.

Figure 4D:
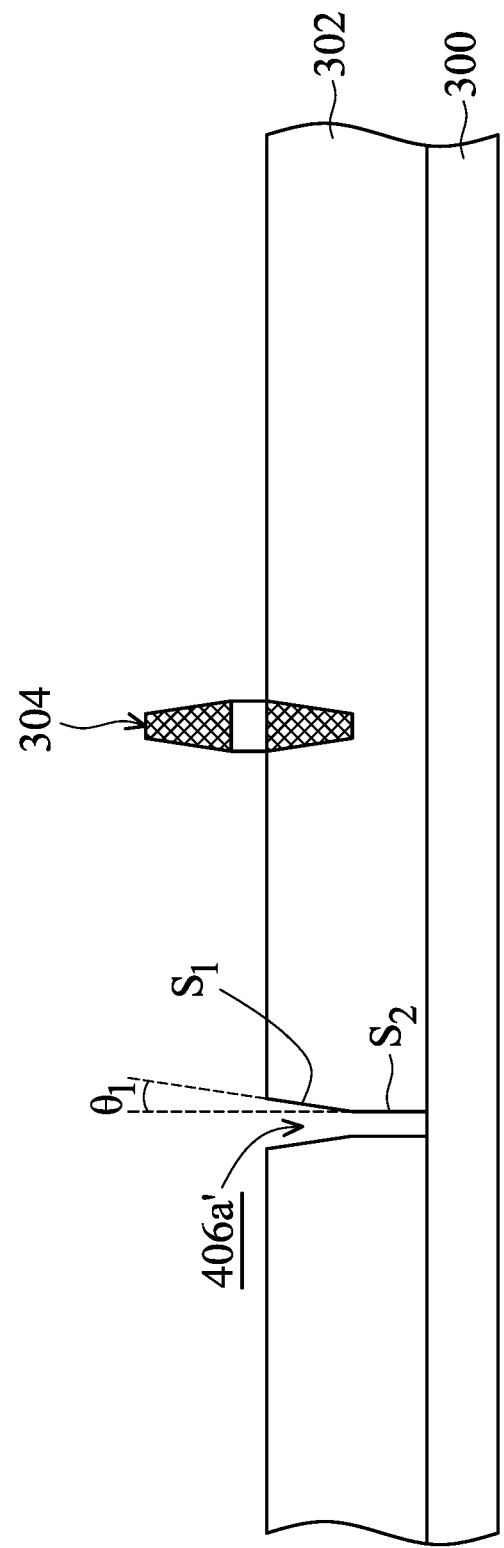

Afterwards, the dicing saw 404 is moved upwards. As shown in FIG. 4D, because of the cutting of the dicing saw 404, the trench 406a is deepened to form a trench 406a' in the semiconductor wafer 302, in accordance with some embodiments. Due to the profiles of the dicing saw 304, the upper portion of the trench 406a' has inclined sidewalls. Due to the profiles of the dicing saw 404, the lower portion of the trench 406a' has vertical sidewalls.

As shown in FIG. 4D, similar to the embodiments illustrated in FIG. 4A, the dicing saw 304 is used to cut a second predetermined region of the semiconductor wafer, in accordance with some embodiments. The dicing saw 304 does not completely cut through the semiconductor wafer 302 to reach the carrier 300. The dicing saw 304 is stopped after the predetermined cutting depth is reached.

Figure 4E:
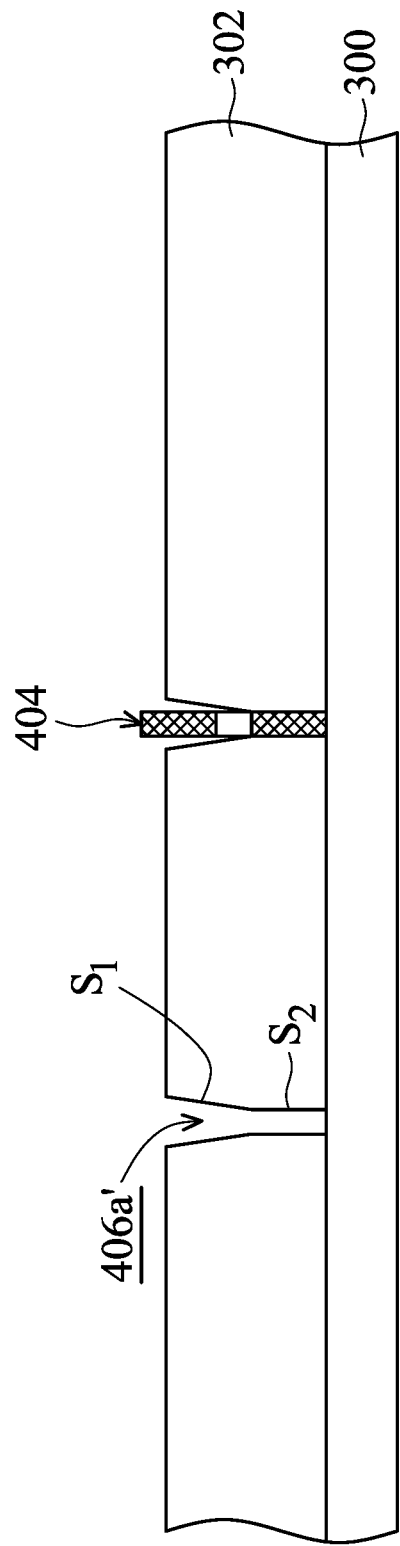

As shown in FIG. 4E, similar to the embodiments illustrated in FIGS. 4B and 4C, the dicing saw 404 is then used to cut a lower portion of the semiconductor wafer 302, in accordance with some embodiments. In some embodiments, the dicing saw 404 cut through the semiconductor wafer 302. The dicing saw 404 may be stopped when the carrier 300 is reached by the dicing saw 404.

Figure 4F:
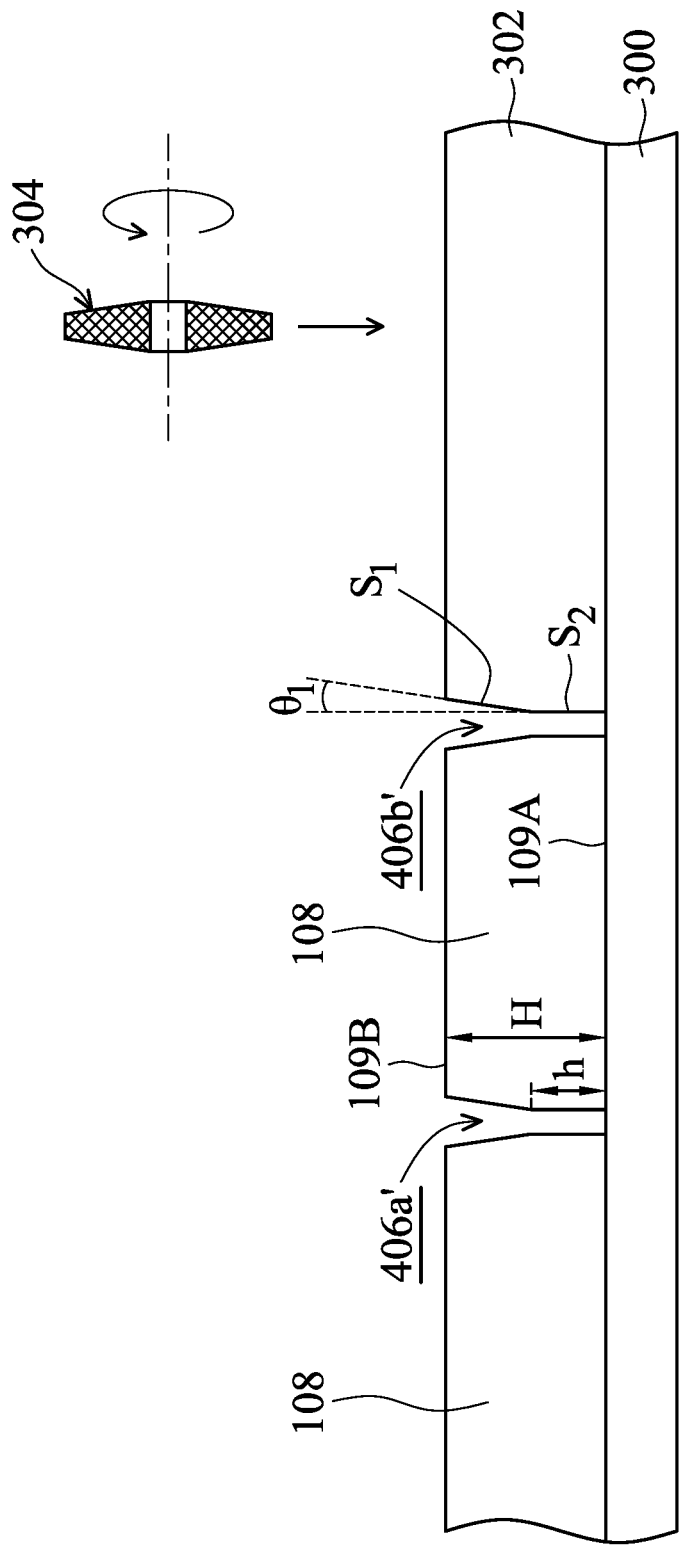

Afterwards, the dicing saw 404 is moved upwards. As shown in FIG. 4F, the dicing saw 304 is moved over a third predetermined dicing region of the semiconductor wafer 302, in accordance with some embodiments. The dicing saw 304 may then be moved towards the semiconductor wafer 302 to cut the third predetermined dicing region of the semiconductor wafer 302.

As shown in FIG. 4F, due to the cutting of the dicing saws 304 and 404 as illustrated in FIGS. 4D and 4E, a trench 406b' is formed in the semiconductor wafer 302, in accordance with some embodiments. Due to the profiles of the dicing saw 304, the upper portion of the trench 406a' has inclined sidewalls. Due to the profiles of the dicing saw 304, the lower portion of the trench 406a' has vertical sidewalls.

In some embodiments, after subsequent cutting processes, more trenches (not shown) intersecting the trenches 406a' and 406b' are formed. As a result, chip structures 108 each separated from other portions of the semiconductor wafer 302 are obtained. Each of the chip structure 108 has an inclined sidewall $S_1$ extending from the back side 109B towards the front side 109A. The inclined sidewall $S_1$ is at an acute angle $\theta_1$ to the vertical. The acute angle $\theta_1$ may be greater than about 12 degrees. The acute angle $\theta_1$ may be in a range from about 12 degrees to about 45 degrees. In some embodiments, each of the chip structure 108 has a vertical sidewall $S_2$ extending from the bottom edge of the inclined sidewall $S_1$ to the front side 109A.

As shown in FIG. 4F, the portion of the chip structure 108 with the vertical sidewall $S_2$ has a thickness h, and the chip structure 108 has a total thickness H. The ratio (h/H) of the thickness h to the total thickness H may be smaller than about 0.6. For example, the ratio (h/H) may be in a range from about 0.3 to about 0.6. In some embodiments, the portion of the chip structure 108 with the vertical sidewall $S_2$ is substantially as thick as the portion of the chip structure 108 with the inclined sidewall $S_1$.

In some cases, if the ratio (h/H) is greater than about 0.6, the portion of the chip structure 108 with the inclined sidewall $S_1$ may be too thin. There might be no sufficient space is provided for containing the subsequently formed protective layer. Stress in the subsequently formed protective layer might still be high, which might lead to the formation of cracks and/or defects in the subsequently formed protective layer.

Similar to the chip structure 108 illustrated in FIG. 3D, the edge profile of the chip structure 108 shown in FIG. 4F may also help to reduce and/or release stress in the subsequently formed protective layer that surrounds the chip structure 108.

Figure 5:
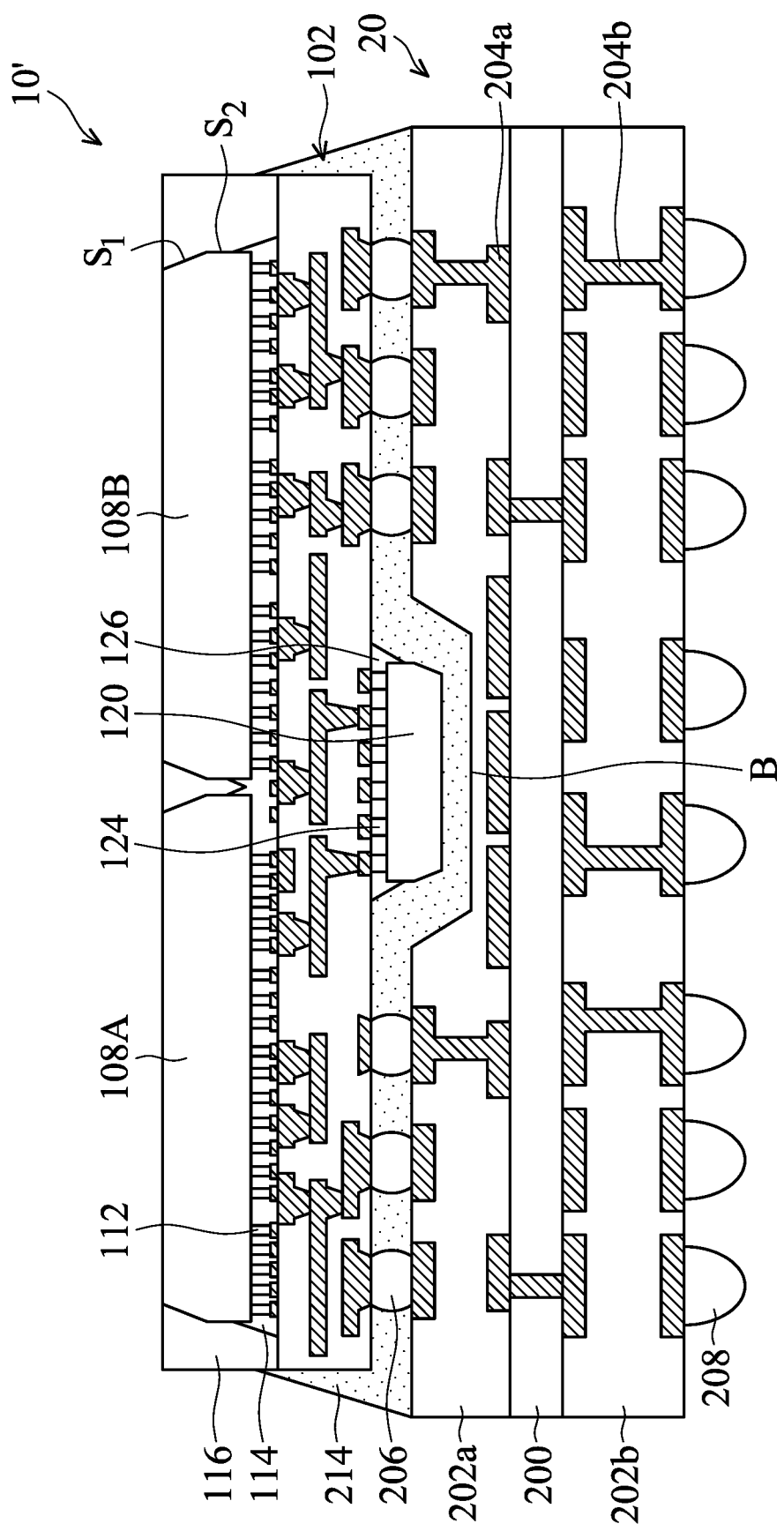
FIG. 5 is a cross-sectional view of a portion of a package structure, in accordance with some embodiments.

FIG. 5 is a cross-sectional view of a portion of a package structure, in accordance with some embodiments. FIG. 5 shows a package structure that is similar to the package structure shown in FIG. 2D. The main difference is that the chip structure 108 shown in FIG. 4F is used as the chip structure 108A, 108B, or 120. As shown in FIG. 5, the vertical sidewall $S_2$ connects the bottom edge of the inclined sidewall $S_1$. In some embodiments, the topmost point of the underfill material 214 is lower than the topmost point of the underfill material 114, as shown in FIG. 5.

As mentioned above, the chip structures 108A, 108B, or 120 may be obtained using the cutting process illustrated in FIGS. 4A-4F. However, embodiments of the disclosure are not limited thereto. Many variations and/or modifications can be made to embodiments of the disclosure. The chip structures 108A, 108B, or 120 may be obtained using another cutting process.

Figure 14A:
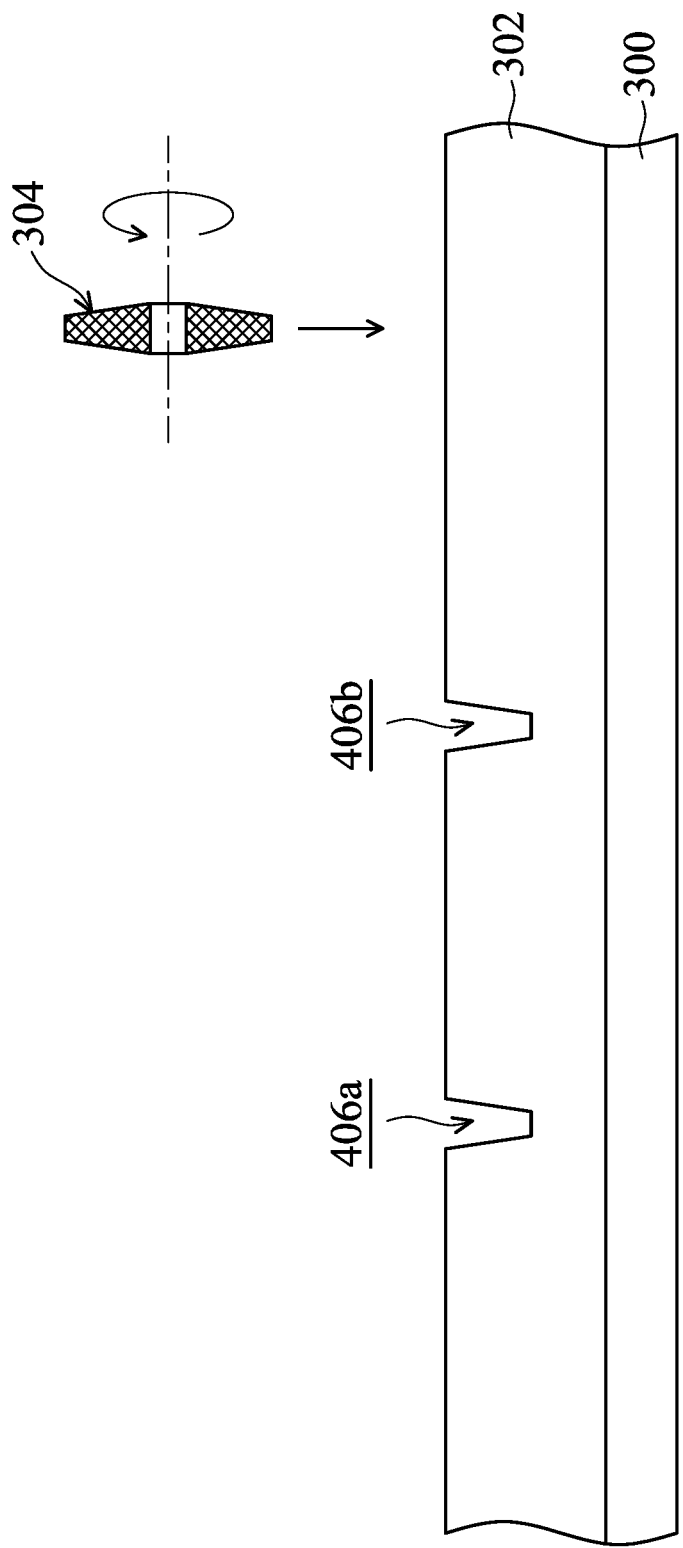
FIGS. 14A-14C are cross-sectional views of various stages of a process for forming a portion of a package structure, in accordance with some embodiments.
Figure 14B:
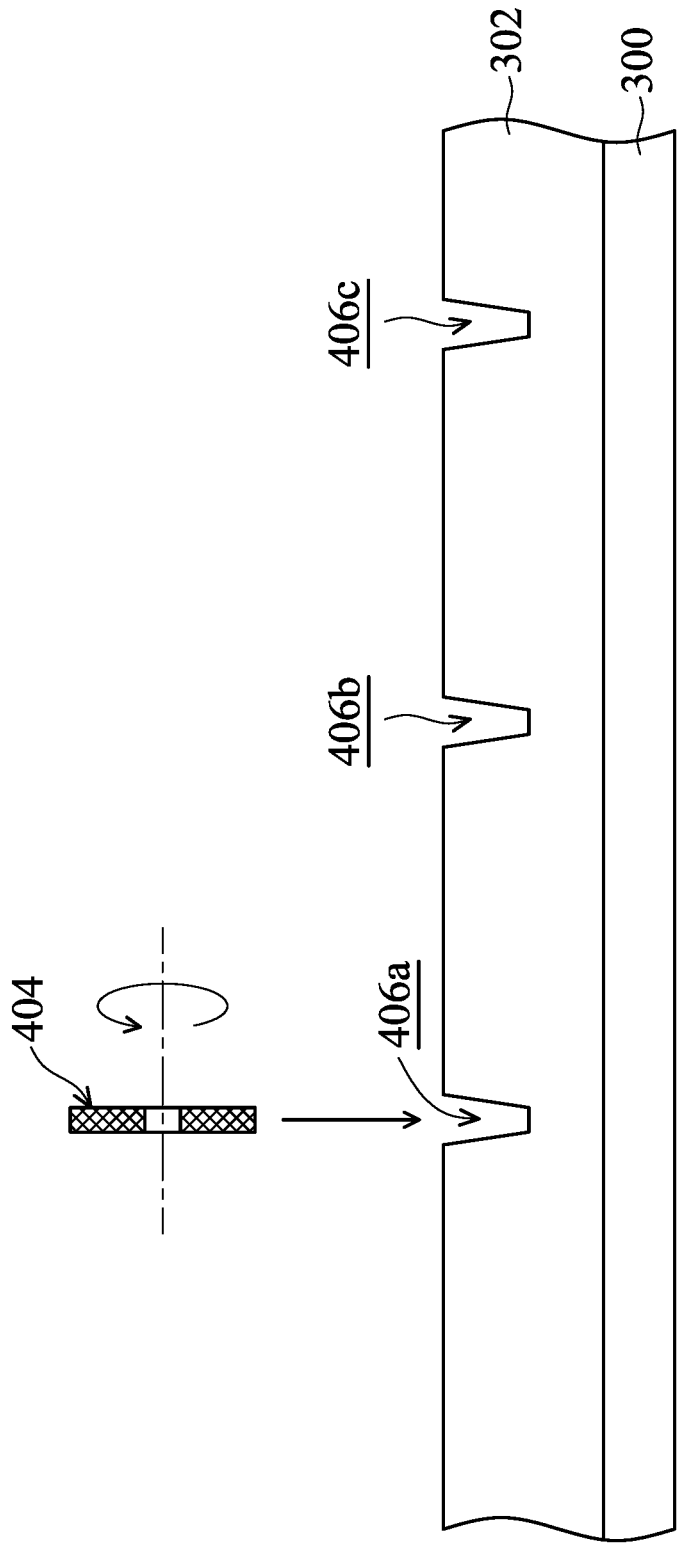
Figure 14C:
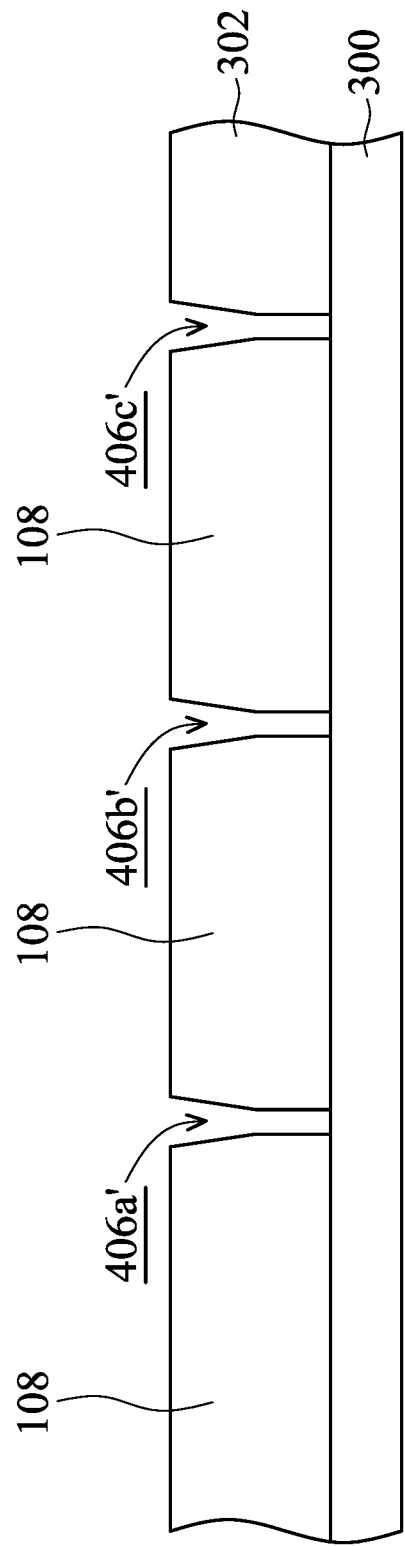

FIGS. 14A-14C are cross-sectional views of various stages of a process for forming a portion of a package structure, in accordance with some embodiments. FIGS. 14A-14C show a cutting process that may be used to form the chip structures 108A, 108B, or 120 in FIG. 5.

As shown in FIG. 14A, similar to the embodiments illustrated in FIG. 4A, the dicing saw 304 is used to cut multiple upper portions of the semiconductor wafer 302, in accordance with some embodiments. As a result, trenches 406a and 406b that extend into the semiconductor wafer 302 are formed. As shown in FIG. 14A, the dicing saw 304 is then moved over a next predetermined dicing region for a subsequent cutting operation.

After multiple trenches (including the trenches 406a, 406b, and 406c) are formed, the dicing saw 404 is used for the subsequent cutting operations, as shown in FIG. 14B in accordance with some embodiments. Similar to the embodiments illustrated in FIGS. 4B-4D, the dicing saw 404 is used for deepen the trenches 406a, 406b, and 406c.

As shown in FIG. 14C, after the cutting of the dicing saw 404, trenches 406a', 406b' and 406c' that completely penetrate through the semiconductor wafer 302 are formed, in accordance with some embodiments. As shown in FIG. 14C, similar to the embodiments illustrated in FIG. 4F, multiple chip structures 108 are obtained. Each of the chip structures 108 has an inclined sidewall and a vertical sidewall that connect to each other. The chip structure 108 may be used as the chip structure 108A, 108B, or 120 of the package structure shown in FIG. 5.

As mentioned above, the inclined sidewall of the chip structure may help to release and/or reduce the stress in the protective layer 116 or the underfill material 214. However, embodiments of the disclosure are not limited thereto. Many variations and/or modifications can be made to embodiments of the disclosure. In some other embodiments, the inclined sidewall of the chip structure is a curved sidewall. The chip structure having the inclined and curved sidewalls may be obtained using a suitable cutting process.

Figure 13A:
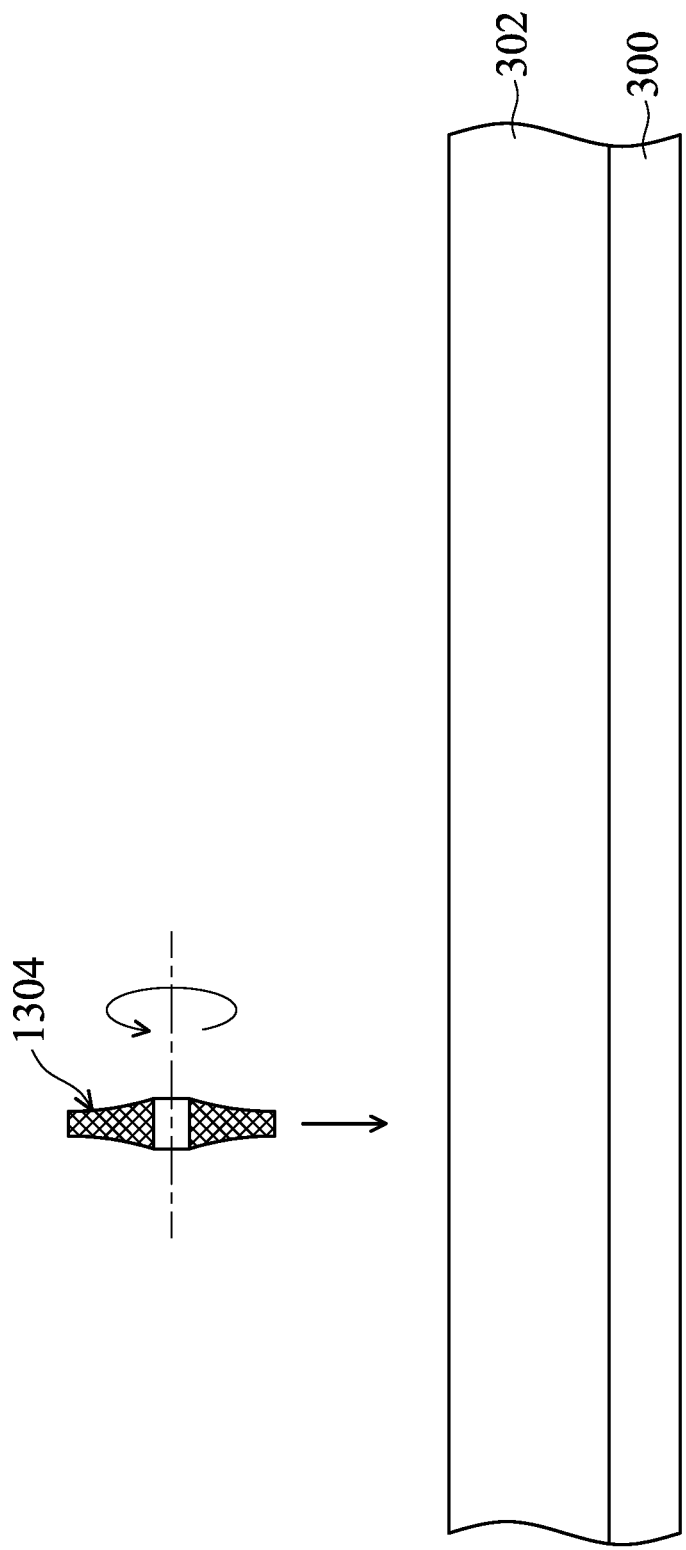
FIGS. 13A-13B are cross-sectional views of various stages of a process for forming a portion of a package structure, in accordance with some embodiments.
Figure 13B:
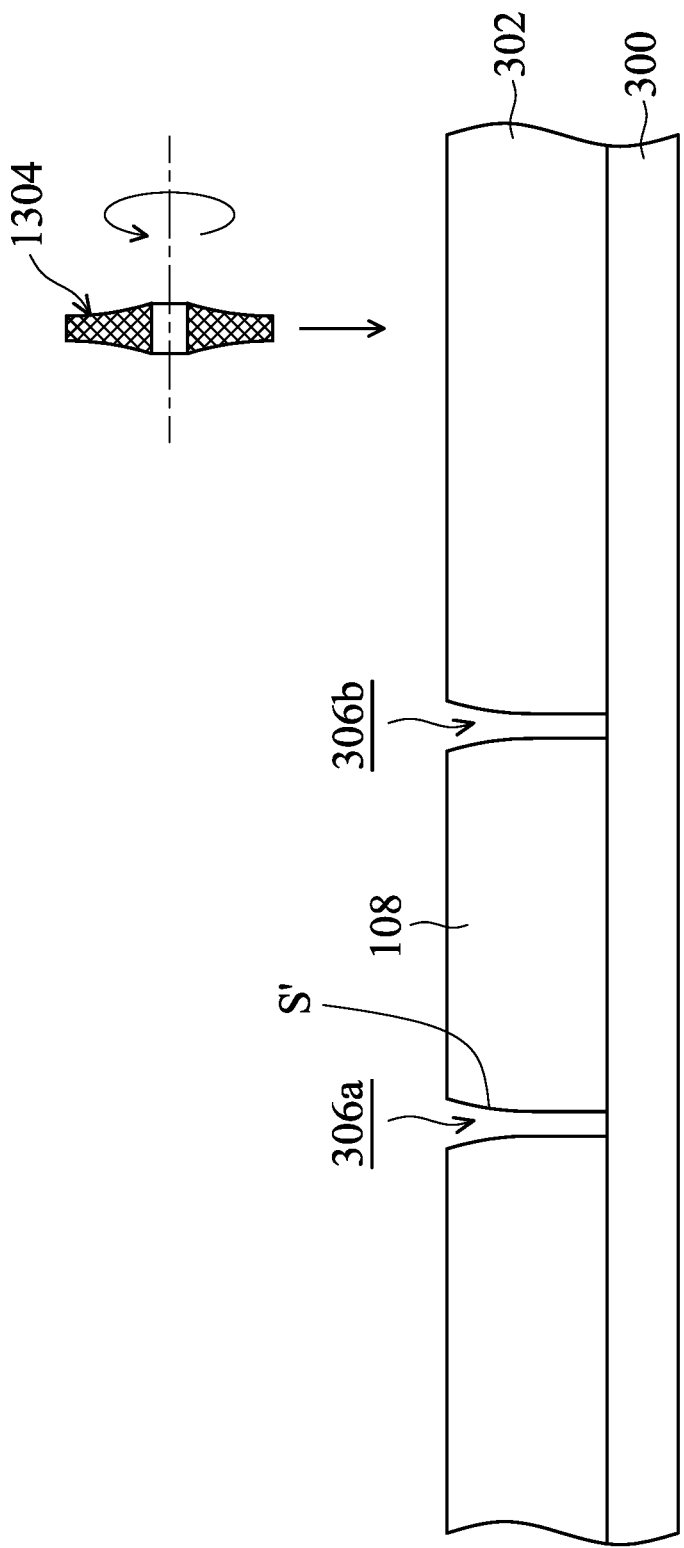

FIGS. 13A-13B are cross-sectional views of various stages of a process for forming a portion of a package structure, in accordance with some embodiments. As shown in FIG. 13A, a dicing saw 1304 is provided over the semiconductor wafer 302. Similar to the dicing saw 304, the dicing saw 1304 has a rotational axis that is used to rotate the blade of the dicing saw 1304. In some embodiments, the blade of the dicing saw 1304 has curved and inclined sidewalls, as shown in FIG. 13A. The portion of the blade near the rotational axis is wider than the portion of the blade near the edge of the blade.

As shown in FIG. 13B, similar to the embodiments illustrated in FIGS. 3B-3D, the semiconductor wafer 302 is cut by the dicing saw 1304, so as to form trenches 306a and 306b, in accordance with some embodiments. Due to the profile of the dicing saw 1304, the trenches 306a and 306b have curved and inclined sidewalls S'. After the cutting process is completed, multiple chip structures 108 are formed. Each of the chip structures 108 has curved and inclined sidewalls. The chip structures 108 with the curved and inclined sidewalls S' may be used to replace the chip structures 108A, 108B, or 120 in the package structure shown in FIG. 2D or 5.

Due to the curved and inclined sidewalls S' of the chip structure 108A, 108B, and/or 120, more available space around the chip structure 108A, 108B, and/or 120 are/is provided. A greater amount of the protective layer 116 and/or the underfill material 214 are/is allowed to be formed around the chip structure 108A, 108B, and/or 120. The protective layer 116 and/or the underfill material 214 may function like a buffer component around the chip structure 108A, 108B, and/or 120. The stress may thus be released and/or reduced in the protective layer 116 and/or the underfill material 214. The curved edge profile of the chip structure 108A, 108B, or 120 may allow a better adhesion between the chip structure 108A, 108B, or 120 and the protective layer 116 and/or the underfill material 214. The reliability and performance of the package structure are greatly improved.

Many variations and/or modifications can be made to embodiments of the disclosure. For example, the die package used for bonding to the circuit substrate 20 may be formed using different processes.

Figure 6C:
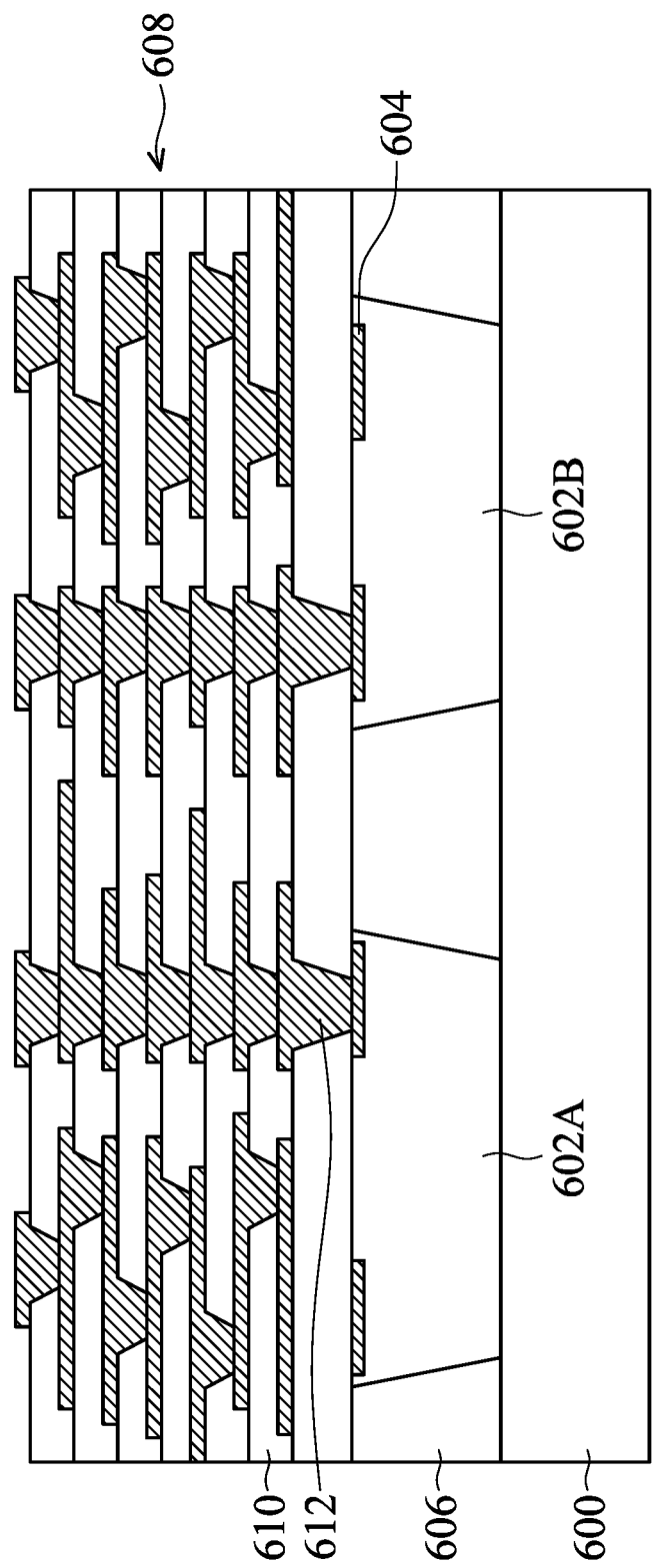

FIGS. 6A-6E are cross-sectional views of various stages of a process for forming a portion of a package structure, in accordance with some embodiments. As shown in FIG. 6A, a carrier substrate 600 is received or provided. The material of the carrier substrate 600 may be the same as or similar to that of the carrier substrate 100 illustrated in FIG. 1A.

As shown in FIG. 6A, chip structures (or chip-containing structures) 602A and 602B are disposed over the carrier substrate 600, in accordance with some embodiments. In some embodiments, the chip structures 602A and 602B are attached onto the carrier substrate 600 using an adhesive layer or an adhesive glue. Each of the chip structures 602A and 602B may be a single semiconductor die, system-on-integrated-chips (SoIC), and/or a package including one or more semiconductor dies that are encapsulated or protected. In some embodiments, the chip structures 602A and 602B are system-on-chip (SoC) chips that include multiple functions. In some embodiments, the front sides of the chip structures 602A and 602B face upwards with the back sides of the chip structures 602A and 602B facing the carrier substrate 600. As shown in FIG. 6A, each of the chip structures 602A and 602B includes conductive pads (or conductive pillars) 604 at the front sides.

Similar to the chip structures 108A and 108B shown in FIG. 1B, each of the chip structures 602A and 602B has one or more inclined sidewalls $S_1$, as shown in FIG. 6A. In some embodiments, the inclined sidewalls $S_1$ directly connect the front side and the back side of the chip structures 602A or 602B. In some embodiments, the front side where the conductive pads (or conductive pillars) 604 are formed and the back side have different widths. In some embodiments, the front side is wider than the back side, as shown in FIG. 6A.

The inclined sidewalls of the chip structures 602A and 602B may help to release or reduce stress in a subsequently formed protective layer that surrounds the chip structures 602A and 602B. As shown in FIG. 6A, the inclined sidewall $S_1$ is at an acute angle $\theta_1$ to the vertical. The acute angle $\theta_1$ may be greater than about 12 degrees. The acute angle $\theta_1$ may be in a range from about 12 degrees to about 45 degrees.

As shown in FIG. 6B, a protective layer 606 is formed over the carrier substrate 600 to surround the chip structures 602A and 602B, in accordance with some embodiments. The material and formation method of the protective layer 606 may be the same as or similar to those of the protective layer 116 illustrated in FIG. 1C. In some embodiments, the conductive pads 604 of the chip structures 602A and 602B are exposed without being covered by the protective layer 606.

Due to the profiles of the chip structures 602A and 602B, a greater amount of the molding material is allowed to be formed around the chip structures 602A and 602B. The molding material may function like a buffer component during the thermal molding process for forming the protective layer 606. The molding stress may thus be released and/or reduced. The reliability and performance of the package structure are greatly improved.

As shown in FIG. 6C, a redistribution structure 608 is formed over the protective layer 606 and the chip structures 602A and 602B, in accordance with some embodiments. Similar to the redistribution structure 102 in FIG. 1A, the redistribution structure 608 includes multiple insulating layers 610 and multiple conductive features 612. Each of the conductive pads 604 may be electrically connected to the respective conductive feature 612 in the redistribution structure 608. The material and formation method of the redistribution structure 608 may be the same as or similar to those of the redistribution structure 102 illustrated in FIG. 1A.

Figure 6D:
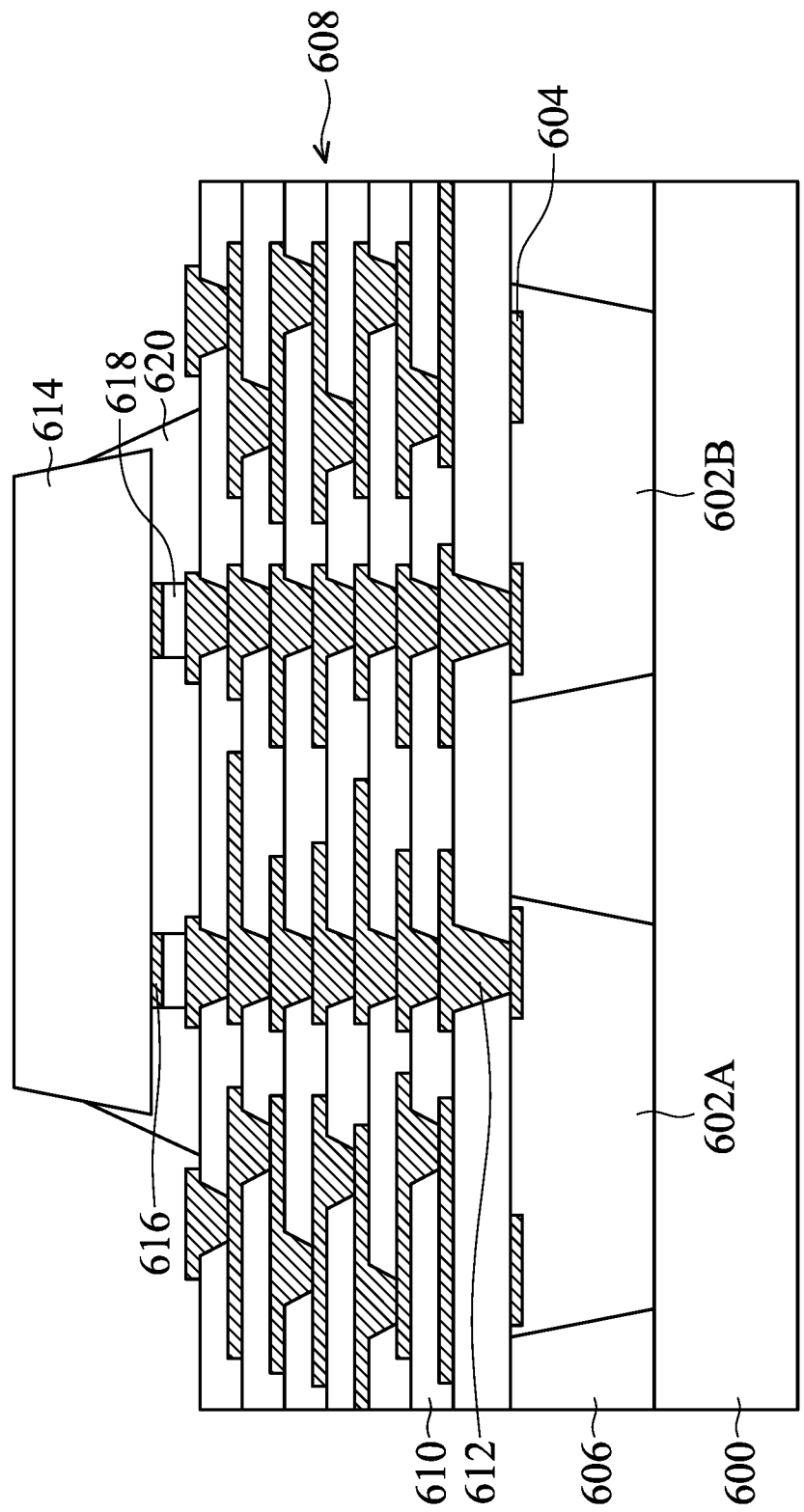

As shown in FIG. 6D, a chip structure (or a chip-containing structure) 614 is bonded onto the redistribution structure 608 through conductive connectors 618, in accordance with some embodiments. The material and formation method of the conductive connectors 618 may be the same as or similar to those of the conductive connectors 124 illustrated in FIG. 1E. Through the conductive connectors 618, electrical connections are formed between the conductive pillars (or conductive pads) 616 of the chip structure 614 and some of the conductive features 612 of the redistribution structure 608. In some embodiments, the chip structure 614 forms electrical connections between the chip structures 602A and 602B through some of the conductive features 612 of the redistribution structure 608, as shown in FIG. 6D.

The chip structure 614 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 614 is an interconnection die that receive and/or transfer electrical signals to and/or from the chip structures 602A and 602B. In some embodiments, the chip structure 614 has no active devices formed therein. In some other embodiments, the chip structure 614 includes active devices and passive devices formed therein. In some other embodiments, a surface mounted device is used to replace the chip structure 614. The surface mounted device may include, for example, resistors, capacitors, insulators, one or more other suitable devices, or a combination thereof. In some embodiments, the chip structure 614 or the surface mounted device have inclined sidewalls.

As shown in FIG. 6D, an underfill material 620 is formed over the redistribution structure 608 to surround the conductive connectors 618, in accordance with some embodiments. The material and formation method of the underfill material 620 may be the same as or similar to those of the underfill material 126 illustrated in FIG. 1E. Many variations and/or modifications can be made to embodiments of the disclosure. In some other embodiments, the underfill material 620 is not formed.

Figure 6E:
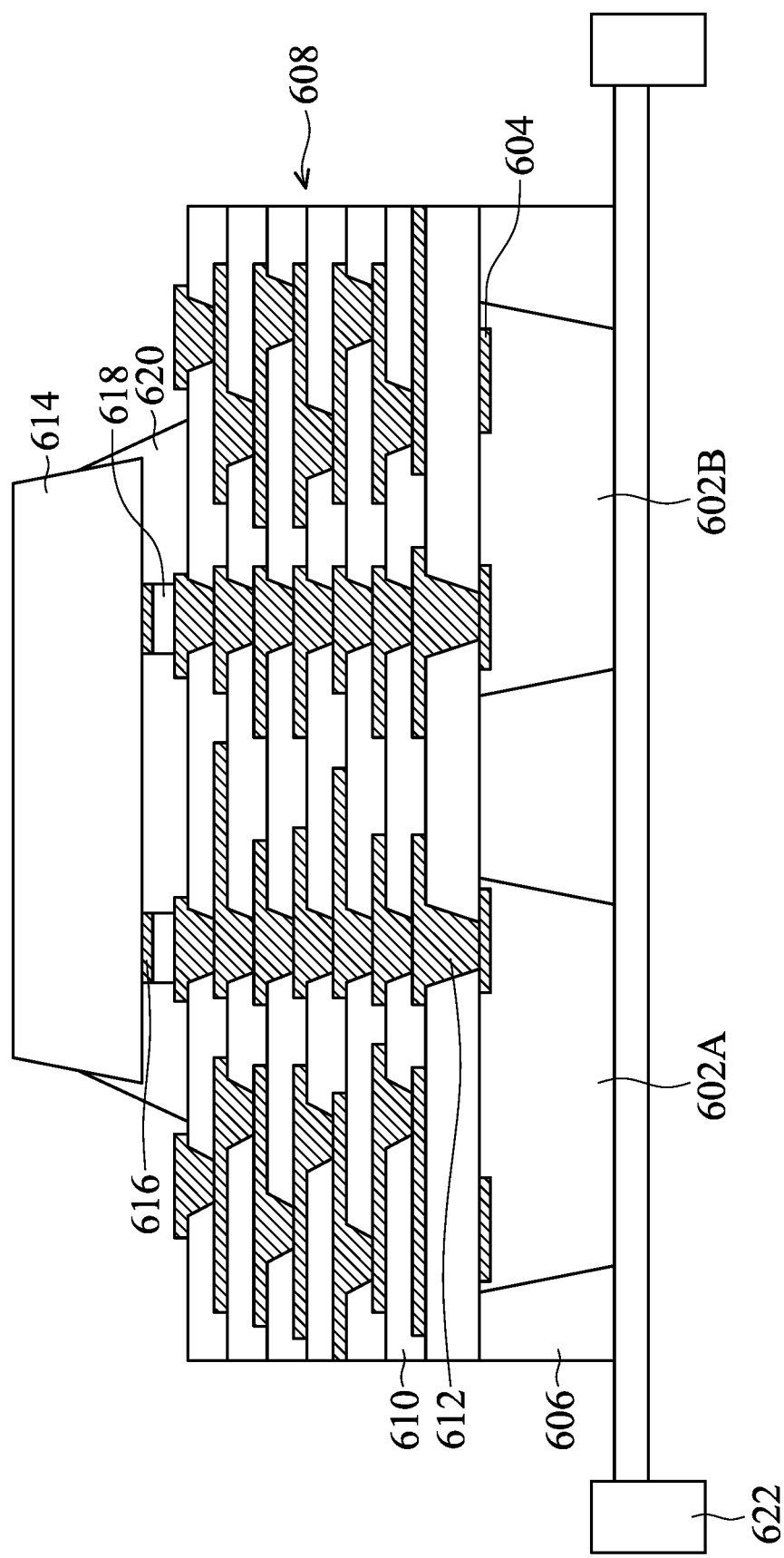

As shown in FIG. 6E, the carrier substrate 600 is removed, and then a carrier tape 622 is used to hold the package structure, in accordance with some embodiments. In some embodiments, a sawing process is then used to cut through the structure shown in FIG. 6E into multiple separate die packages. After the sawing process, one die package is picked from the carrier tape 622 and turned upside down. The die package is to be integrated with other elements to form a larger package structure.

However, embodiments of the disclosure are not limited thereto. Many variations and/or modifications can be made to embodiments of the disclosure. In some other embodiments, the sawing process is not performed to separate the structure in FIG. 6E into multiple smaller die packages. The entirety of the wafer-level package structure may directly be integrated into a large package structure without being sawed.

Figure 7:
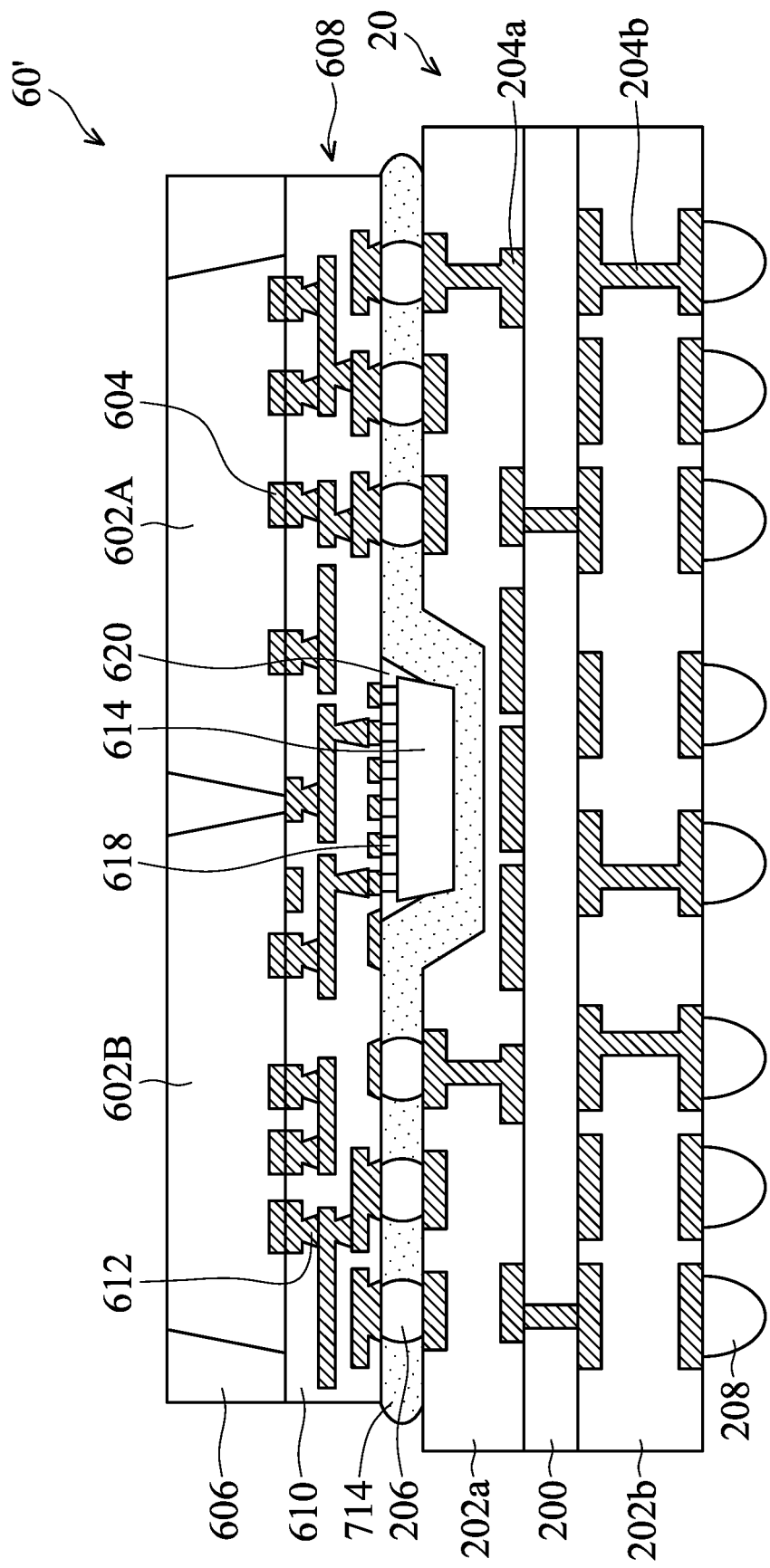
FIG. 7 is a cross-sectional view of a portion of a package structure, in accordance with some embodiments.

FIG. 7 is a cross-sectional view of a portion of a package structure, in accordance with some embodiments. Similar to the embodiments illustrated in FIG. 2C, a die package 60' that is the same as or similar to the die package shown in FIG. 6E is received or provided. In some embodiments, the die package 60' is picked and placed over the circuit substrate 20. Afterwards, the die package 60' is bonded to the circuit substrate 20 through the bonding structures 206.

Afterwards, an underfill material 714 is formed to surround the bonding structures 206 and the chip structure 614, as shown in FIG. 7 in accordance with some embodiments. The material and formation method of the underfill material 714 may be the same as or similar to those of the underfill material 214 illustrated in FIG. 2D. Due to the profiles of the chip structure 614, a greater amount of the underfill material 714 is allowed to be formed around the chip structure 614. The underfill material 714 may function like a buffer component. The stress may thus be released and/or reduced. The reliability and performance of the package structure are greatly improved.

In some embodiments, the chip structures 602A and 602B are in direct contact with the redistribution structure 608, as shown in FIG. 7. The conductive pads 604 of the chip structures 602A and 602B are directly connected to some of the conductive features 612 of the redistribution structure 608 without other conductive connectors (such as solder bumps) formed therebetween. In some embodiments, the conductive features 612 of the redistribution structure 608 include multiple conductive vias. In some embodiments, each of the conductive vias has an upper end near the chip structure 602A or 602B and a lower end near the circuit substrate 20. In some embodiments, the lower end is wider than the upper end, as shown in FIG. 7.

In some embodiments, the redistribution structure 102 or 608 includes multiple polymer-containing insulating layers, as shown in FIG. 2D or 7. However, embodiments of the disclosure are not limited thereto. Many variations and/or modifications can be made to embodiments of the disclosure. In some embodiments, the redistribution structure that is bonded to the circuit substrate 20 includes multiple insulating layers that are not made of or not mainly made of polymer materials. In some embodiments, a semiconductor interposer substrate is used as a redistribution structure to replace the polymer-containing redistribution structure 102 or 608.

Figure 8A:
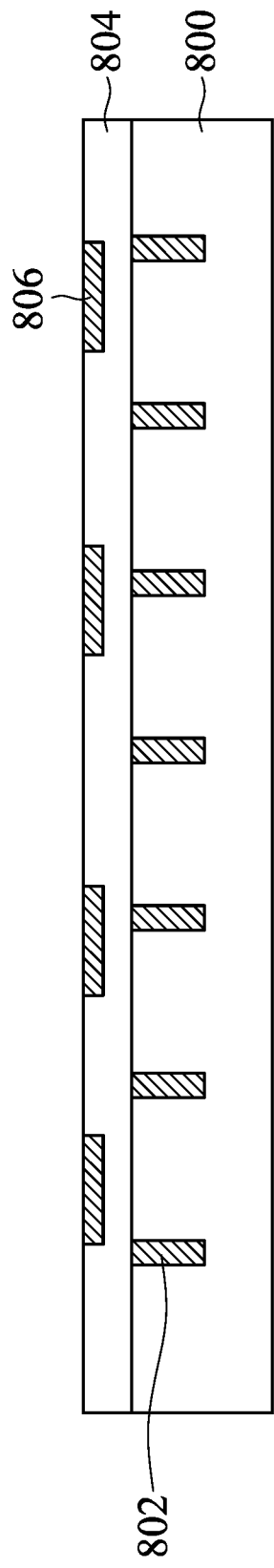
FIGS. 8A-8K are cross-sectional views of various stages of a process for forming a portion of a package structure, in accordance with some embodiments.

FIGS. 8A-8K are cross-sectional views of various stages of a process for forming a portion of a package structure, in accordance with some embodiments. In some embodiments, a semiconductor wafer (such as a silicon wafer) is received or provided. The semiconductor wafer includes a semiconductor substrate 800 and an interconnection structure 804 formed over the semiconductor substrate 800, as shown in FIG. 8A.

The semiconductor substrate 800 may be made of or include silicon, germanium, silicon germanium, gallium arsenide, one or more other suitable materials, or a combination thereof. The interconnection structure 804 may include multiple dielectric layers and multiple conductive features. The dielectric layers may be made of or include silicon oxide, silicon carbide, carbon-containing silicon oxide, silicon nitride, silicon oxynitride, one or more other suitable materials, or a combination thereof. The conductive features may include conductive lines, conductive vias, and conductive pads. The conductive features may be made of or include copper, aluminum, tungsten, cobalt, ruthenium, one or more other suitable materials, or a combination thereof. The formation of the interconnection structure 804 may involve multiple deposition processes, multiple patterning processes, and multiple planarization processes. As shown in FIG. 8A, conductive pads (or topmost metal layers) 806 of the interconnection structure 804 are shown.

In some embodiments, multiple conductive structures 802 are formed in the semiconductor substrate 800, as shown in FIG. 8A. The conductive structures 802 may function as conductive vias. In some embodiments, the semiconductor substrate 800 is partially removed to form multiple openings before the formation of the interconnection structure 804. The openings may be formed using one or more photolithography processes and one or more etching processes.

Afterwards, a dielectric layer (not shown in FIG. 8A) is deposited over the semiconductor substrate 800, in accordance with some embodiments. The dielectric layer extends along the sidewalls and bottoms of the openings. The dielectric layer may be used to electrically isolate the semiconductor substrate 800 and the conductive structures 802 that will be formed later. The dielectric layer may be made of or include silicon oxide, silicon oxynitride, silicon nitride, carbon-containing silicon oxide, carbon-containing silicon oxynitride, carbon-containing silicon nitride, silicon carbide, one or more other suitable materials, or a combination thereof. The dielectric layer may be deposited using a chemical vapor deposition (CVD) process, an atomic layer deposition (ALD) process, a thermal oxidation process, one or more other applicable processes, or a combination thereof.

A conductive material is then deposited over the semiconductor substrate 800 to partially or completely fill the openings of the semiconductor substrate 800, in accordance with some embodiments. The conductive material may be made of or include copper, aluminum, cobalt, tungsten, gold, titanium, platinum, one or more other suitable materials, or a combination thereof. The conductive material may be deposited using a physical vapor deposition (PVD) process, a CVD process, an ALD process, an electroplating process, an electroless plating process, one or more other applicable processes, or a combination thereof.

Afterwards, the conductive material is partially removed. As a result, the remaining portions of the conductive material form the conductive structures 802, as shown in FIG. 8A. A planarization process may be used to remove the portions of the conductive material outside of the openings. The remaining portions of the conductive material in the openings form the conductive structures 802. The planarization process may include a chemical mechanical polishing (CMP) process, a grinding process, an etching process, a dry polishing process, one or more other applicable processes, or a combination thereof.

Afterwards, the interconnection structure 804 is formed over the semiconductor substrate 800 and the conductive structures 802, in accordance with some embodiments. As mentioned above, the interconnection structure 804 includes multiple dielectric layers and multiple conductive features. Some of the conductive features may be used to form electrical connections to the conductive structures 802.

Figure 8B:
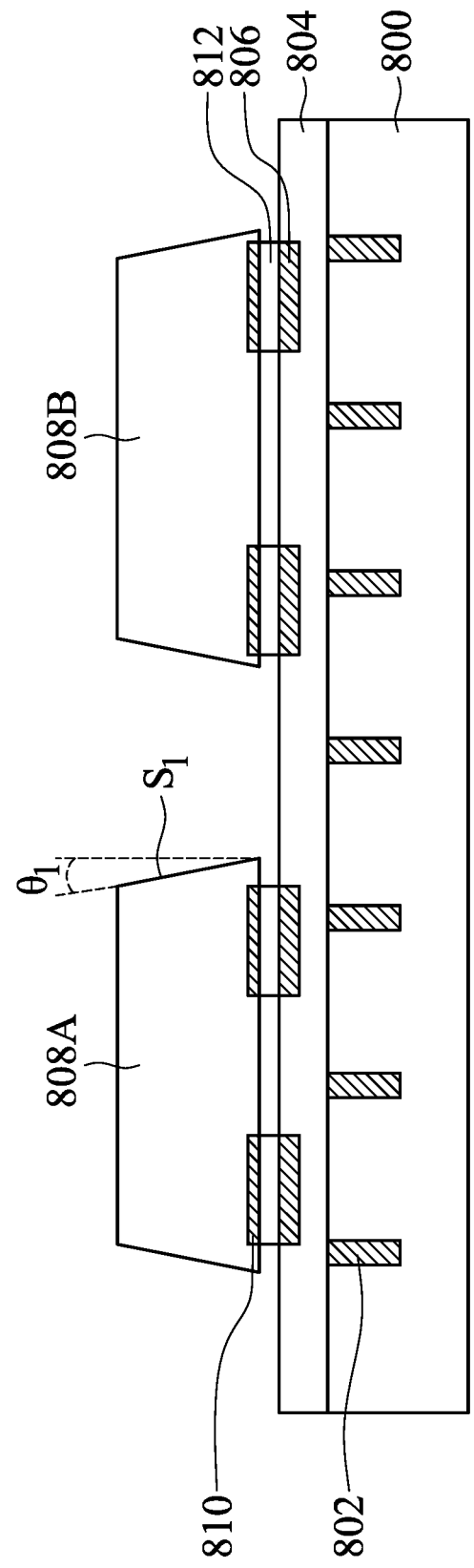

As shown in FIG. 8B, chip structures (or chip-containing structures) 808A and 808B are bonded onto the semiconductor wafer, in accordance with some embodiments. In some embodiments, the chip structures 808A and 808B are bonded onto the semiconductor wafer through conductive connectors 812 formed between the conductive pads 806 of the interconnection structure 804 and conductive pads 810 of the chip structures 808A and 808B. The conductive connectors 812 may include solder bumps. In some other embodiments, the chip structures 808A and 808B are bonded onto the semiconductor wafer through direct hybrid bonding that includes, for example, metal-to-metal bonding and dielectric-to-dielectric bonding. In these cases, the conductive connectors 812 are not formed.

Each of the chip structures 808A and 808B may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, the back sides of the semiconductor dies face upwards with the front sides of the semiconductor dies facing the interconnection structure 804. In some embodiments, some of the semiconductor dies include memory devices such as high bandwidth memory (HBM) devices.

Similar to the chip structures 108A and 108B shown in FIG. 1B, each of the chip structures 808A and 808B has one or more inclined sidewalls $S_1$, as shown in FIG. 8B. In some embodiments, the inclined sidewalls $S_1$ directly connect the front side and the back side of the chip structures 808A or 808B. In some embodiments, the front side where the conductive pillars (or conductive pads) 810 are formed and the back side have different widths. In some embodiments, the front side is wider than the back side, as shown in FIG. 8B.

The inclined sidewalls of the chip structures 808A and 808B may help to release or reduce stress in a subsequently formed protective layer that surrounds the chip structures 808A and 808B. As shown in FIG. 8B, the inclined sidewall $S_1$ is at an acute angle $\theta_1$ to the vertical. The acute angle $\theta_1$ may be greater than about 12 degrees. The acute angle $\theta_1$ may be in a range from about 12 degrees to about 45 degrees.

Figure 8C:
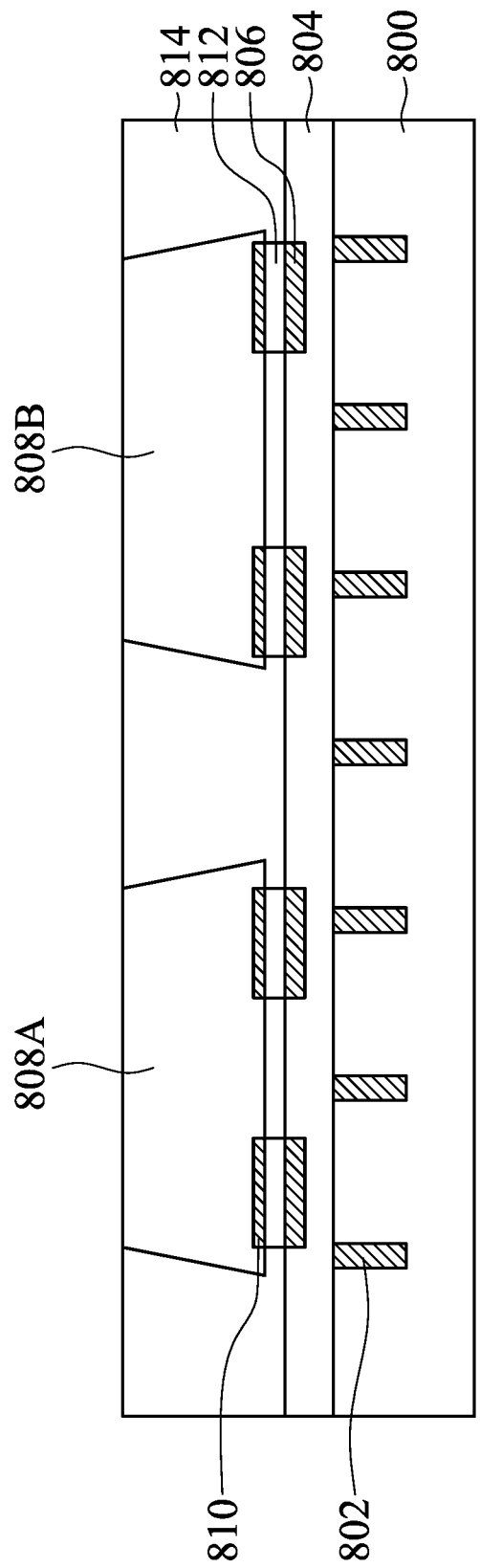

As shown in FIG. 8C, a protective layer 814 is formed to surround the chip structures 808A and 808B, in accordance with some embodiments. The material and formation method of the protective layer 814 may be the same as or similar to those of the protective layer 116 illustrated in FIG. 1C. In some embodiments, the top surface of the protective layer 814 is substantially level with the back sides of the chip structures 808A and 808B.

Due to the profiles of the chip structures 808A and 808B, a greater amount of the molding material is allowed to be formed around the chip structures 808A and 808B. The molding material may function like a buffer component during the thermal molding process for forming the protective layer 814. The molding stress may thus be released and/or reduced. The reliability and performance of the package structure are greatly improved.

Figure 8D:
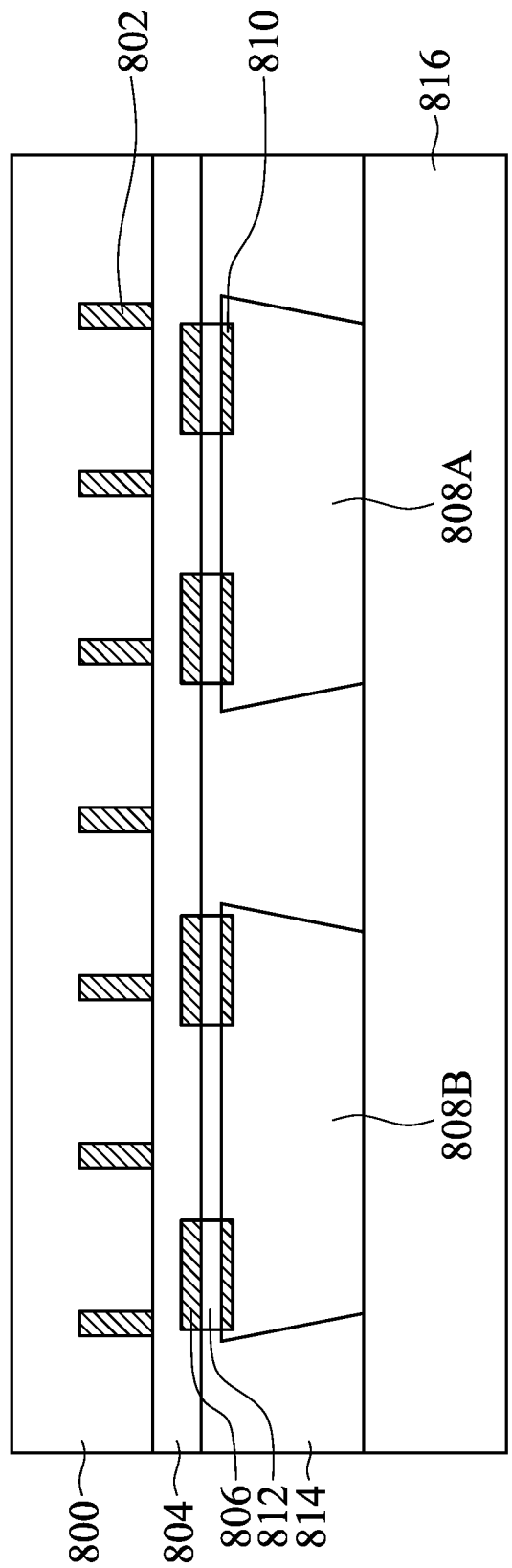

As shown in FIG. 8D, the structure shown in FIG. 8C is turned upside down and then attached to a temporary support substrate 816, in accordance with some embodiments. The temporary support substrate 816 may be made of a dielectric material, a semiconductor material, a metal material, one or more other suitable materials, or a combination thereof. For example, the temporary support substrate 816 is a silicon wafer or a glass wafer. In some embodiments, an adhesive tape or adhesive glue may be used to attach the temporary support substrate 816 to the protective layer 814.

Figure 8E:
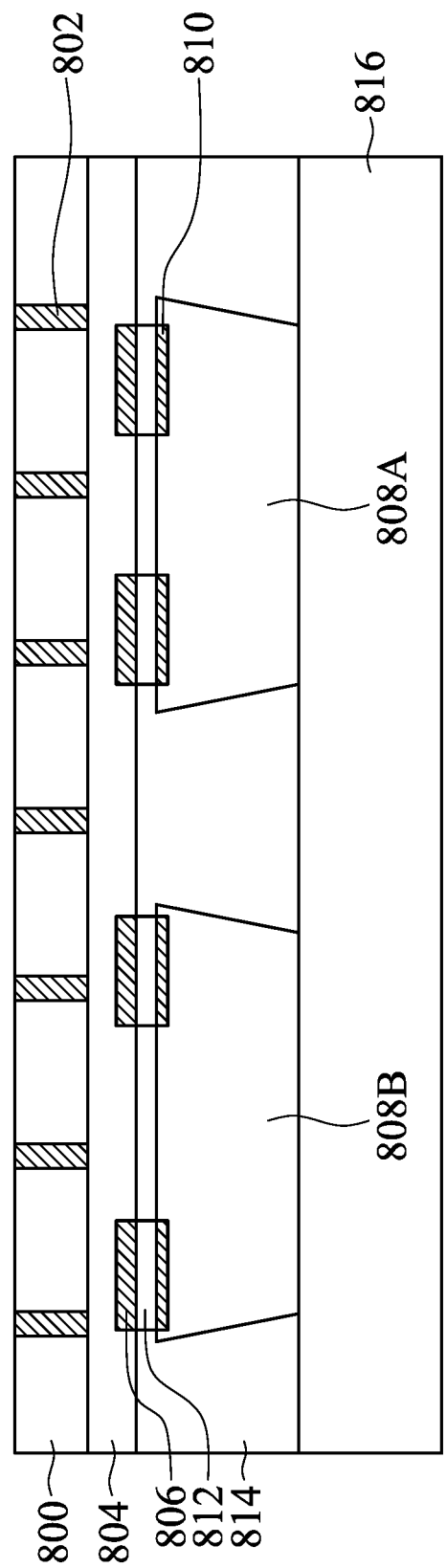

As shown in FIG. 8E, the semiconductor substrate 800 is partially removed to expose the conductive structures 802, in accordance with some embodiments. The conductive structures 802 may penetrate through the semiconductor substrate 800 after the semiconductor substrate 800 is partially removed. The conductive structures 802 may thus function as through substrate vias (TSVs). In some embodiments, a thinning process is used to partially remove the semiconductor substrate 800. The thinning process may include a CMP process, a grinding process, an etching process, a dry polishing process, one or more other applicable processes, or a combination thereof.

Figure 8F:
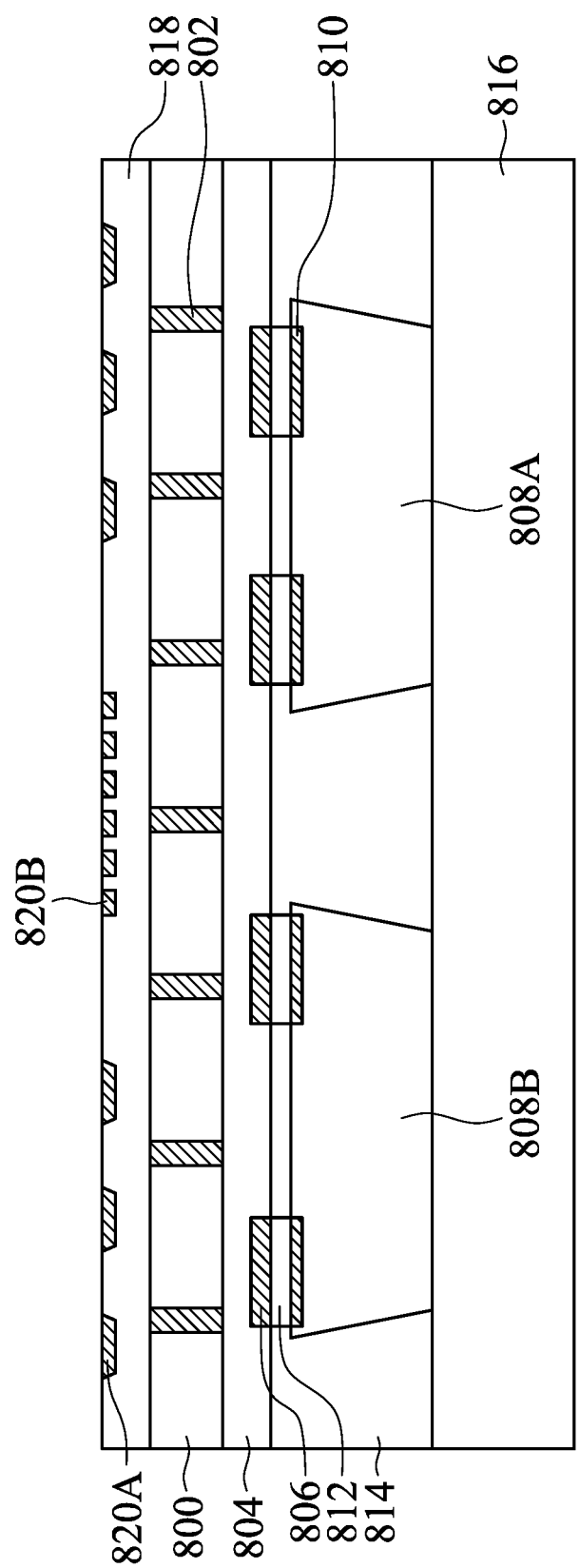

As shown in FIG. 8F, an interconnection structure 818 is formed over the semiconductor substrate 800 and the conductive structures 802, in accordance with some embodiments. Similar to the interconnection structure 804, the interconnection structure 818 includes multiple dielectric layers and multiple conductive features. The conductive features of the interconnection structure 818 include conductive lines, conductive vias, and conductive pads 820A and 820B. In some embodiments, each of the conductive structures 802 is electrically connected to the respective conductive pad 820A or 820B and the respective conductive pad 806.

Many variations and/or modifications can be made to embodiments of the disclosure. In some other embodiments, similar to the redistribution structure 102 shown in FIG. 1A, the interconnection structure 818 includes multiple polymer-containing insulating layers and multiple conductive features.

Figure 8G:
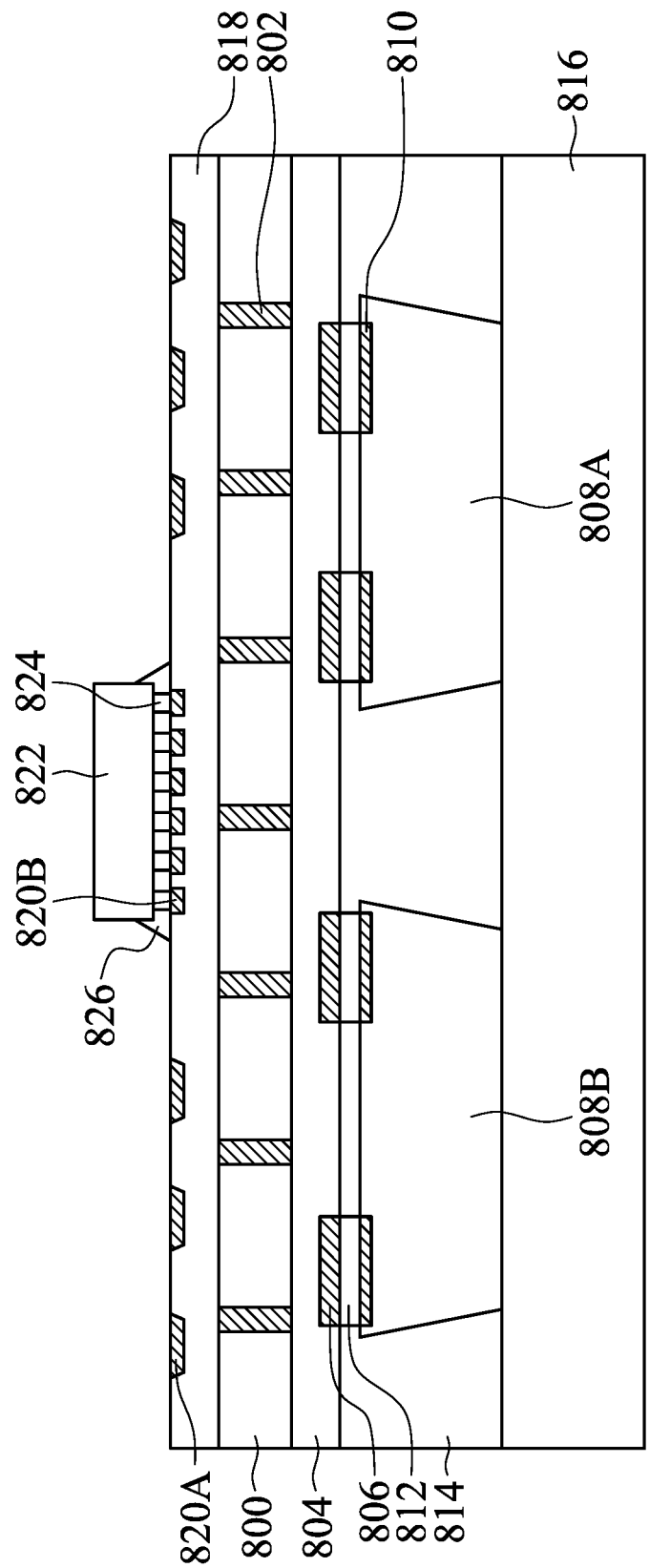

As shown in FIG. 8G, a chip structure (or chip-containing structure) 822 is bonded onto the interconnection structure 818, in accordance with some embodiments. In some embodiments, the chip structure 822 is bonded onto the conductive pads 820B of the interconnection structure 818 through conductive connectors 824. The material and formation method of the conductive connectors 824 may be the same as or similar to those of the conductive connectors 124 illustrated in FIG. 1E.

Many variations and/or modifications can be made to embodiments of the disclosure. In some other embodiments, the chip structure 822 is bonded onto the interconnection structure 818 through direct hybrid bonding that includes metal-to-metal bonding and dielectric-to-dielectric bonding. In these cases, the conductive connectors 824 are not formed.

The chip structure 822 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 822 is an interconnection die that receive and/or transfer electrical signals to and/or from the chip structures 808A and 808B. In some embodiments, the chip structure 822 has no active devices formed therein. In some other embodiments, the chip structure 822 includes active devices and passive devices formed therein. In some other embodiments, a surface mounted device is used to replace the chip structure 822. The surface mounted device may include, for example, resistors, capacitors, insulators, one or more other suitable devices, or a combination thereof. In some embodiments, the chip structure 822 or the surface mounted device have inclined sidewalls.

As shown in FIG. 8G, an underfill material 826 is formed over the interconnection structure 818 to surround the conductive connectors 824, in accordance with some embodiments. The material and formation method of the underfill material 826 may be the same as or similar to those of the underfill material 126 illustrated in FIG. 1E. Many variations and/or modifications can be made to embodiments of the disclosure. In some other embodiments, the underfill material 826 is not formed.

However, embodiments of the disclosure are not limited thereto. In some embodiments, the chip structure 822 is bonded onto the interconnection structure 818 through direct hybrid bonding. In some embodiments, the underfill material 826 is not formed since no additional conductive connectors are formed between the chip structure 822 and the interconnection structure 818.

Figure 8H:
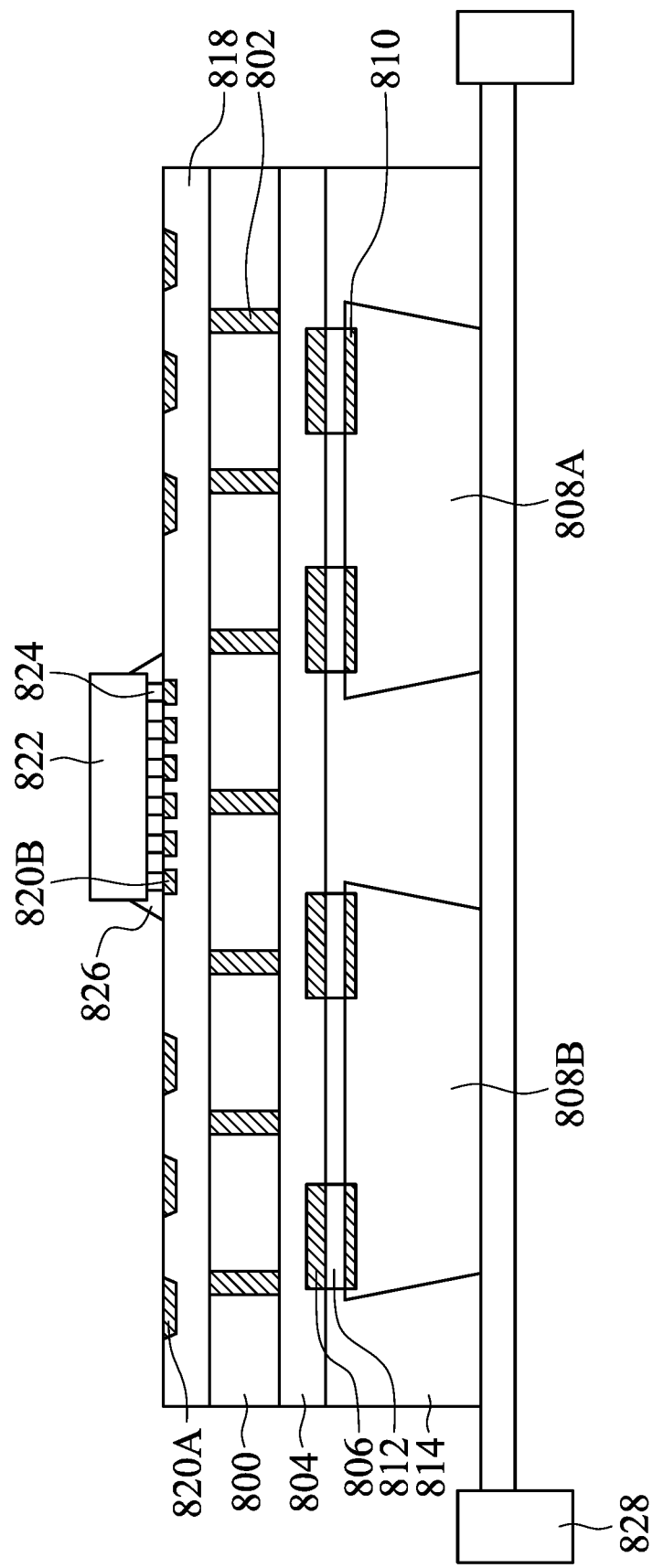

As shown in FIG. 8H, the temporary support substrate 816 is removed, and then a carrier tape 828 is used to hold the package structure, in accordance with some embodiments. In some embodiments, a sawing process is then used to cut through the structure shown in FIG. 8H into multiple separate die packages.

However, embodiments of the disclosure are not limited thereto. Many variations and/or modifications can be made to embodiments of the disclosure. In some other embodiments, the sawing process is not performed to separate the structure in FIG. 8H into multiple smaller die packages. The entirety of the wafer-level package structure may directly be integrated into a large package structure without being sawed.

Figure 8I:
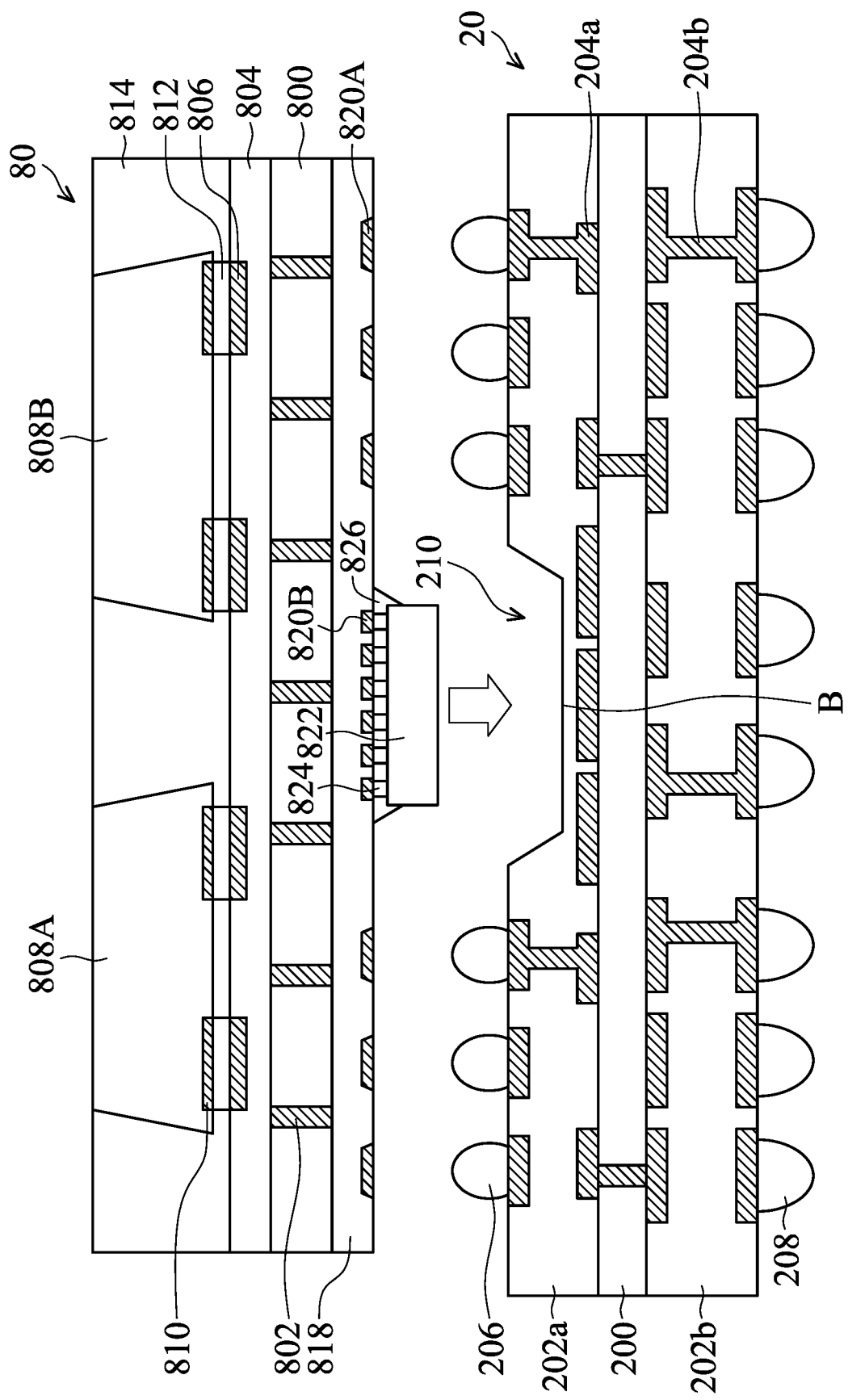

After the sawing process, one die package 80 is picked from the carrier tape 828 and turned upside down, as shown in FIG. 8I in accordance with some embodiments. The die package 80 is to be integrated with other elements (such as the circuit substrate 20) to form a larger package structure, as shown in FIG. 8I.

Figure 8J:
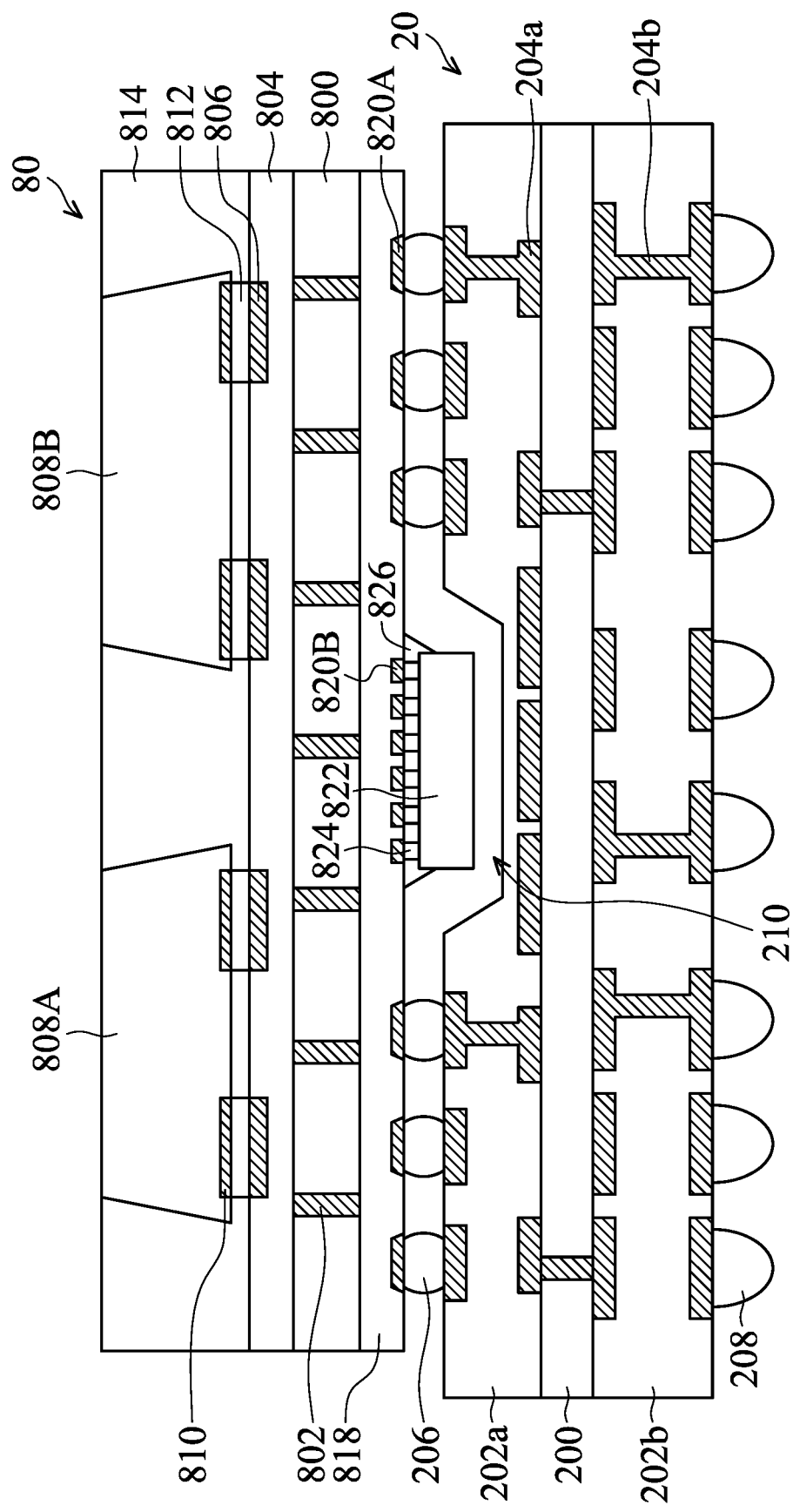

As shown in FIG. 8J, similar to the embodiments illustrated in FIG. 2C, the die package 80 is placed over the circuit substrate 20, in accordance with some embodiments. Afterwards, the die package 80 is bonded to the circuit substrate 20 through the bonding structures 206.

Figure 8K:
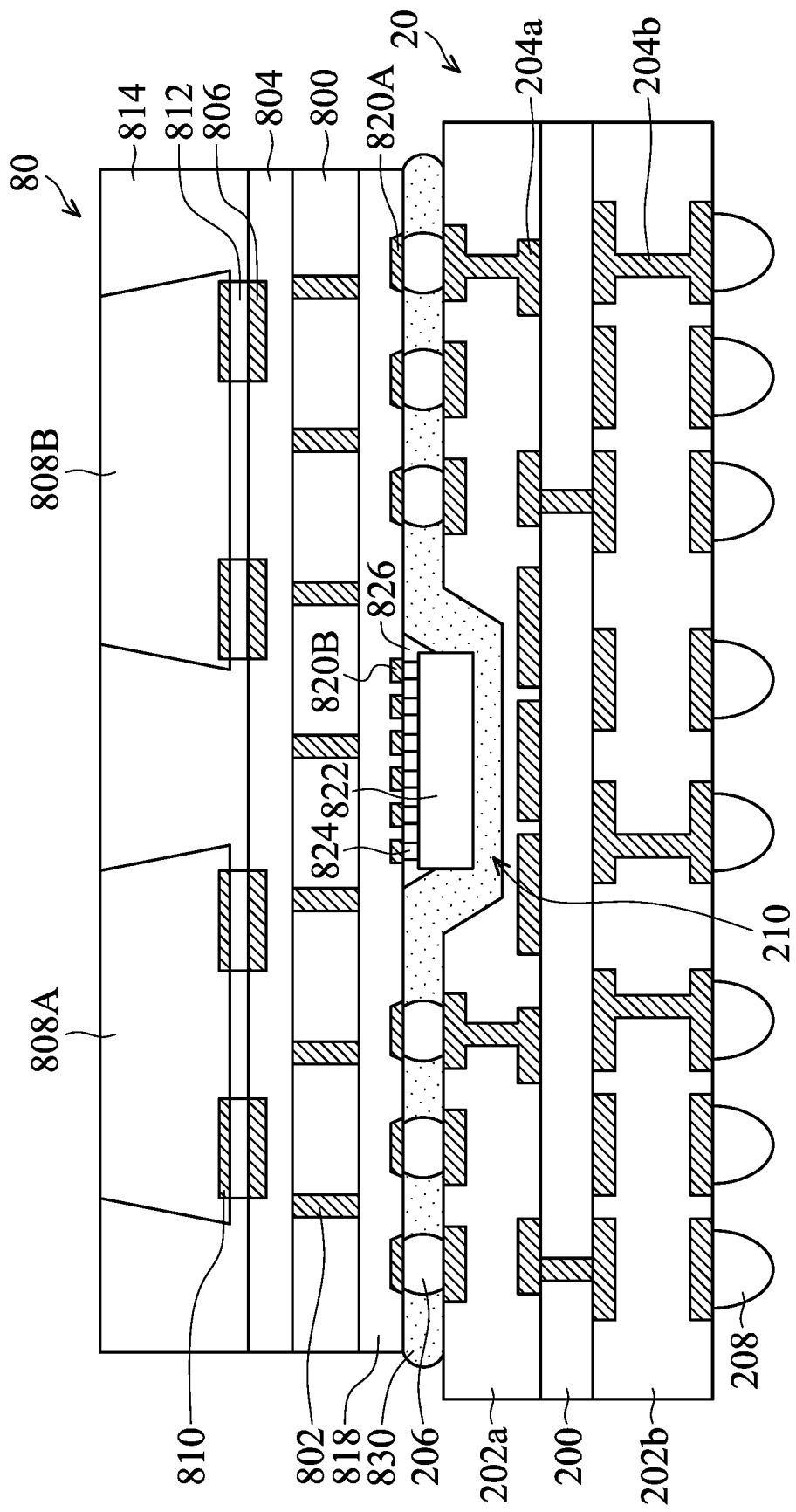

As shown in FIG. 8K, an underfill material 830 is formed to surround the bonding structures 206 and the chip structure 822, in accordance with some embodiments. The material and formation method of the underfill material 830 may be the same as or similar to those of the underfill material 214 illustrated in FIG. 2D. Due to the profiles of the chip structure 822, a greater amount of the underfill material 830 is allowed to be formed around the chip structure 822. The underfill material 830 may function like a buffer component. The stress may thus be released and/or reduced. The reliability and performance of the package structure are greatly improved.

As mentioned above, in some embodiments, the inclined sidewalls directly connect the front side and the back side of the chip structures. In some embodiments, the front side where the conductive pillars (or conductive pads) are formed is wider than the back side of the chip structure. However, embodiments of the disclosure are not limited thereto. Many variations and/or modifications can be made to embodiments of the disclosure. In some other embodiments, the front side of the chip structure where the conductive pillars (or conductive pads) are formed is narrower than the back side of the chip structure.

Figure 11:
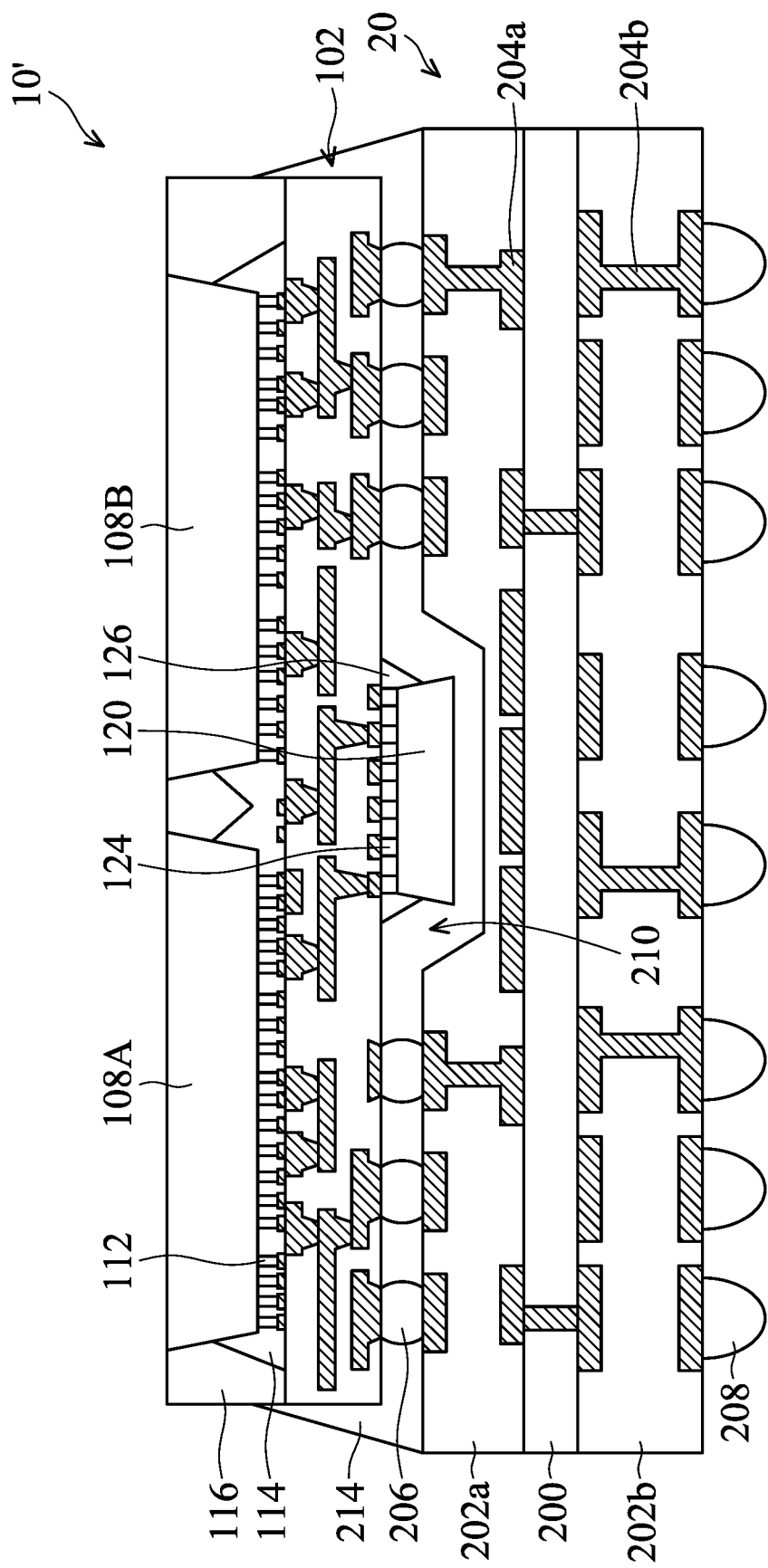
FIG. 11 is a cross-sectional view of a portion of a package structure, in accordance with some embodiments.

FIG. 11 is a cross-sectional view of a portion of a package structure, in accordance with some embodiments. As shown in FIG. 11, a package structure that is similar to the package structure shown in FIG. 2D is formed. The main difference is that the back side of the chip structure 108A, 108B, or 120 is wider than the front side of the chip structure 108A, 108B, or 120 where the conductive pads are formed. Similarly, the inclined sidewalls of the chip structure 108A, 108B, or 120 may help to improve the reliability and performance of the package structure. The chip structure that has wider back side and narrower front side may also be used to replace one or some of the chip structures shown in FIG. 5, 6E, 7, or 8K.

Many variations and/or modifications can be made to embodiments of the disclosure. In some embodiments, the inclined degrees of the sidewalls of different chip structures in a package structure are different from each other.

Figure 12:
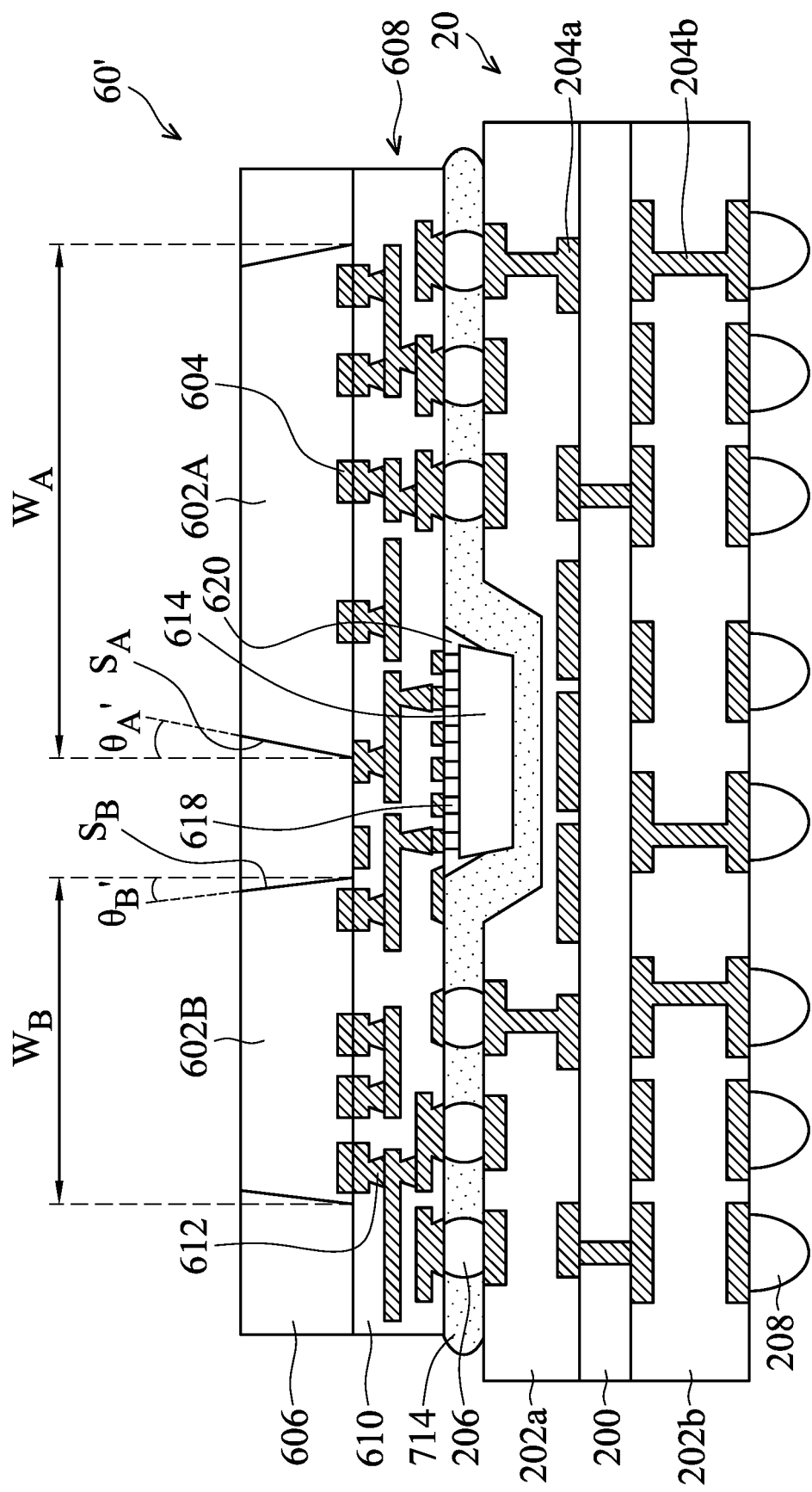
FIG. 12 is a cross-sectional view of a portion of a package structure, in accordance with some embodiments.

FIG. 12 is a cross-sectional view of a portion of a package structure, in accordance with some embodiments. As shown in FIG. 12, a package structure that is similar to the package structure shown in FIG. 7 is formed. The main difference is that the inclined degrees of the sidewalls of the chip structures 602A and 602B are different from each other. As shown in FIG. 12, the chip structure 602A has a width $W_A$, and the chip structures 602B has a width $W_B$. In some embodiments, the width $W_A$ is greater than the width $W_B$.

As shown in FIG. 12, the chip structure 602A has an inclined sidewall $S_A$, and the chip structure 602B has an inclined sidewall $S_B$. In some embodiments, the inclined sidewall $S_B$ is steeper than the inclined sidewall $S_A$. As shown in FIG. 12, the inclined sidewall $S_A$ is at an at an acute angle $\theta_A'$ to the vertical. The acute angle $\theta_A'$ may be greater than about 12 degrees. The acute angle $\theta_A'$ may be in a range from about 12 degrees to about 45 degrees. The inclined sidewall $S_B$ is at an at an acute angle $\theta_B'$ to the vertical. The acute angle $\theta_B'$ may be greater than about 12 degrees. The acute angle $\theta_B'$ may be in a range from about 12 degrees to about 45 degrees.

In some embodiments, the acute angle $\theta_A'$ is greater than the acute angle $\theta_B'$. For example, the acute angle $\theta_A'$ may be in a range from about 20 degrees to about 45 degrees, and the acute angle $\theta_B'$ may be in a range from about 12 degrees to about 30 degrees. In some embodiments, the chip structure 602A that is wider may induce higher stress on the portion of the protective layer 606 near the chip structure 602A. In these cases, due to the greater acute angle $\theta_A'$ of the inclined sidewall $S_A$, a greater amount of the molding material is allowed to be formed around the chip structures 602A than the chip structure 602B. High molding stress may thus be prevented around the chip structure 602A that is wider. The reliability and performance of the package structure are greatly improved.

Many variations and/or modifications can be made to embodiments of the disclosure. The chip structures that have different inclined degrees of sidewalls may be used to replace one or some of the chip structures shown in FIG. 5, 6E, 7, or 8K.

Many variations and/or modifications can be made to embodiments of the disclosure. In some other embodiments, the acute angles $\theta_A'$ and the acute angle $\theta_B'$ of the chip structures 602A and 602B are substantially equal to each other.

Embodiments of the disclosure provide a package structure that includes one or more chip structures with inclined sidewalls and a protective layer surrounding the chip structures. Due to the inclined sidewalls of the chip structures, more available space around the chip structures is provided. A greater amount of the molding material or underfill material is allowed to be formed around the chip structures. The molding material or the underfill material may function like a buffer component during the thermal molding process for forming the protective layer or the underfill material. The stress may thus be released and/or reduced. The reliability and performance of the package structure are greatly improved.

In accordance with some embodiments, a method for forming a package structure is provided. The method includes disposing a chip structure over a substrate. The chip structure has an inclined sidewall, the inclined sidewall is at an acute angle to a vertical, the vertical is a direction perpendicular to a main surface of the chip structure, and the acute angle is greater than about 12 degrees. The method also includes forming a protective layer to surround the chip structure.

In accordance with some embodiments, a package structure is provided. The package structure includes a chip structure over a redistribution structure. The chip structure has an inclined sidewall, the inclined sidewall is at an acute angle to a vertical, the vertical is a direction perpendicular to a main surface of the chip structure, and the acute angle is greater than about 12 degrees. The package structure also includes a protective layer over the redistribution structure. The protective layer surrounds the chip structure.

In accordance with some embodiments, a package structure is provided. The package structure includes a chip structure over a redistribution structure. The chip structure has a front side, a back side, and a sidewall connecting the front side and the back side. The front side and the bottom side have different widths. The package structure also includes a protective layer over the redistribution structure. The protective layer surrounds the chip structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a chip structure having opposite surfaces with different widths, wherein the chip structure has an inclined sidewall between the opposite surfaces, the chip structure has a first side region, a second side region, and a corner region, the first side region and the second side region meet at the corner region, the chip structure has a first inclined sidewall in the first side region, the chip structure has a second inclined sidewall in the corner region, and the first inclined sidewall is steeper than the second inclined sidewall, wherein in a top view, the corner region has a rounded profile, the first side region has a first substantially straight-line profile and extends towards the corner region along a first direction, the second side region has a second substantially straight-line profile and extends towards the corner region along a second direction, and the second direction is perpendicular to the first direction; and
   a protective layer laterally surrounding the chip structure.

2. The package structure as claimed in claim 1, further comprising:
   a second chip structure below the chip structure, wherein the second chip structure has inclined sidewalls.

3. The package structure as claimed in claim 2, further comprising:
   a third chip structure laterally spaced apart from the chip structure, wherein the protective layer laterally surrounds the third chip structure.

4. The package structure as claimed in claim 3, wherein the third chip structure has inclined sidewalls.

5. The package structure as claimed in claim 4, wherein the second chip structure extends across a portion of the chip structure and a portion of the third chip structure.

6. The package structure as claimed in claim 2, further comprising:
   a redistribution structure between the chip structure and the second chip structure, wherein conductive features of the redistribution structure comprise a plurality of conductive vias, and each of the conductive vias shrinks along a direction towards the chip structure.

7. The package structure as claimed in claim 1, wherein the chip structure further has a vertical sidewall connecting a bottom edge of the inclined sidewall.

8. A package structure, comprising:
   a chip structure over a redistribution structure, wherein the chip structure has an inclined sidewall, the inclined sidewall is at an acute angle to a vertical, the vertical is a direction perpendicular to a main surface of the chip structure, and the acute angle is in a range from about 12 degrees to about 45 degrees, wherein the chip structure has a first side region, a second side region, and a corner region, the first side region and the second side region meet at the corner region, the chip structure has a first inclined sidewall in the first side region, the chip structure has a second inclined sidewall in the corner region, and the first inclined sidewall is steeper than the second inclined sidewall, wherein in a top view, the corner region has a rounded profile, the first side region has a first substantially straight-line profile and extends towards the corner region along a first direction, the second side region has a second substantially straight-line profile and extends towards the corner region along a second direction, and the second direction is perpendicular to the first direction; and
   a protective layer over the redistribution structure, wherein the protective layer surrounds the chip structure.

9. The package structure as claimed in claim 8, wherein in the top view, the chip structure has a second corner region, a third corner region, and a fourth corner region, and the second corner region, the third corner region, and the fourth corner region have rounded profiles.

10. The package structure as claimed in claim 8, wherein the protective layer is in direct contact with the inclined sidewall of the chip structure.

11. The package structure as claimed in claim 8, wherein the chip structure further has a vertical sidewall connecting a bottom edge of the inclined sidewall.

12. The package structure as claimed in claim 8, further comprising a second chip structure over the redistribution structure and surrounded by the protective layer, wherein the second chip structure is wider than the chip structure, the second chip structure has a second inclined sidewall, the second inclined sidewall is at a second acute angle to the vertical, and the second acute angle of the second chip structure is greater than the acute angle of the chip structure.

13. A package structure, comprising:
   a chip structure over a redistribution structure, wherein the chip structure has a front side and a back side opposite to the front side, and the front side and the bottom side have different widths, wherein the chip structure has a first side region, a second side region, and a corner region, the first side region and the second side region meet at the corner region, the chip structure has a first inclined sidewall in the first side region, the chip structure has a second inclined sidewall in the corner region, and the first inclined sidewall is steeper than the second inclined sidewall, wherein in a top view, the corner region has a curved profile, the first side region has a first substantially straight-line profile and extends towards the corner region along a first direction, the second side region has a second substantially straight-line profile and extends towards the corner region along a second direction, and the second direction is perpendicular to the first direction; and
a protective layer over the redistribution structure, wherein the protective layer surrounds the chip structure.

14. The package structure as claimed in claim 13, wherein the chip structure has a sidewall connecting the front side and the back side, and the sidewall comprises at least one inclined portion.

15. The package structure as claimed in claim 13, wherein the sidewall is a curved sidewall.

16. The package structure as claimed in claim 6, further comprising:
a circuit substrate bonded to the redistribution structure, wherein the second chip structure is between the redistribution structure and the circuit substrate.

17. The package structure as claimed in claim 16, wherein a bottommost surface of the second chip structure is vertically between a topmost surface of the circuit substrate and a lower surface of the circuit substrate.

18. The package structure as claimed in claim 13, wherein the redistribution structure has a plurality of conductive features and a plurality of polymer-containing layers surrounding the conductive features, the conductive features of the redistribution structure comprise a plurality of conductive vias, and each of the conductive vias gradually shrinks along a direction towards the chip structure.

19. The package structure as claimed in claim 13, further comprising:
a circuit substrate bonded to the redistribution structure through a plurality of solder bumps;
a second chip structure bonded to the redistribution structure, wherein the circuit substrate laterally surrounds a lower portion of the second chip structure; and
an underfill material laterally surrounding the solder bumps and the second chip structure, wherein the circuit substrate laterally surrounds a lower portion of the underfill material.

20. The package structure as claimed in claim 1, further comprising:
a redistribution structure, wherein the chip structure and the protective layer are over the redistribution structure, the chip structure is in direct contact with a conductive feature of the redistribution structure, and the chip structure is in direct contact with an insulating layer of the redistribution structure.

* * * * *